(12) United States Patent
Drogi et al.

(10) Patent No.: US 7,777,566 B1
(45) Date of Patent: Aug. 17, 2010

(54) AMPLIFIER COMPRESSION ADJUSTMENT CIRCUIT

(75) Inventors: Serge Francois Drogi, Flagstaff, AZ (US); Vikas Vinayak, Menlo Park, CA (US)

(73) Assignee: Quantance, Inc., San Mateo, CA (US)

( * ) Notice: Subject to any disclaimer, the term of this patent is extended or adjusted under 35 U.S.C. 154(b) by 0 days.

(21) Appl. No.: 12/366,143

(22) Filed: Feb. 5, 2009

(51) Int. Cl.
*H03G 3/20* (2006.01)
(52) U.S. Cl. .................. 330/136; 330/129
(58) Field of Classification Search ........... 330/129, 330/136, 279
See application file for complete search history.

(56) References Cited

U.S. PATENT DOCUMENTS

| | | |
|---|---|---|
| 3,900,823 A | 8/1975 | Sokol et al. |
| 4,420,723 A | 12/1983 | de Jager |
| 5,128,629 A | 7/1992 | Trinh |
| 5,142,240 A | 8/1992 | Isota et al. |
| 5,675,288 A | 10/1997 | Peyrotte et al. |
| 5,822,442 A | 10/1998 | Agnew et al. |
| 5,838,274 A | 11/1998 | Johnson et al. |
| 5,880,633 A | 3/1999 | Leizerovich et al. |
| 6,043,707 A | 3/2000 | Budnik |
| 6,133,792 A | 10/2000 | Hansson |
| 6,141,541 A | 10/2000 | Midya et al. |
| 6,166,596 A | 12/2000 | Higashiyama et al. |
| 6,175,273 B1 | 1/2001 | Sigmon et al. |
| 6,252,455 B1 * | 6/2001 | Kurby et al. ............ 330/136 |
| 6,275,685 B1 | 8/2001 | Wessel et al. |
| RE37,407 E | 10/2001 | Eisenberg et al. |
| 6,300,826 B1 | 10/2001 | Mathe et al. |
| 6,353,359 B1 | 3/2002 | Leizerovich |
| 6,377,784 B2 | 4/2002 | McCune |
| 6,404,823 B1 | 6/2002 | Grange et al. |

(Continued)

FOREIGN PATENT DOCUMENTS

EP    0812064 B1    12/1997

(Continued)

OTHER PUBLICATIONS

"The Changing Face of Amplifier Design," Nujira, [online] [Retrieved on Apr. 5, 2006] Retrieved from the Internet<URL:http://www.nujira.com/technology/>.

(Continued)

*Primary Examiner*—Henry K Choe
(74) *Attorney, Agent, or Firm*—Fenwick & West LLP

(57) ABSTRACT

An RF power amplifier system adjusts the supply voltage to the power amplifier based upon an amplitude correction signal indicating the amplitude difference between the amplitude of the RF input signal and an attenuated amplitude of the RF output signal of the power amplifier. A variable gain amplifier (VGA) adjusts the amplitude of the RF input signal, thus providing a second means of adjusting the amplitude of the output of the power amplifier. The gain of the VGA or the supply voltage to the power amplifier is controlled based on the AC components of the amplitude correction signal, while the DC components of the amplitude correction signal are blocked from controlling the VGA or the supply voltage to the power amplifier. The DC level of the gain control of the VGA, the average supply voltage to the power amplifier, or the closed loop gain of the overall amplitude correction loop is controlled separately by a compression control signal.

19 Claims, 18 Drawing Sheets

U.S. PATENT DOCUMENTS

| | | | |
|---|---|---|---|
| 6,437,641 B1 | 8/2002 | Bar-David | |
| 6,445,249 B1 | 9/2002 | Khan et al. | |
| 6,472,934 B1 | 10/2002 | Pehlke | |
| 6,528,975 B2 | 3/2003 | Sander | |
| 6,583,664 B2 | 6/2003 | Mathe et al. | |
| 6,661,210 B2 | 12/2003 | Kimball et al. | |
| 6,677,823 B2* | 1/2004 | Terosky et al. | 330/289 |
| 6,759,902 B2* | 7/2004 | Kossor | 330/136 |
| 6,781,452 B2 | 8/2004 | Cioffi et al. | |
| 6,917,244 B2 | 7/2005 | Rosnell et al. | |
| 6,924,695 B2 | 8/2005 | Cioffi et al. | |
| 6,924,700 B2 | 8/2005 | Taura | |
| 6,924,711 B2 | 8/2005 | Liu | |
| 6,928,272 B2 | 8/2005 | Doi | |
| 7,058,373 B2 | 6/2006 | Grigore | |
| 7,109,897 B1 | 9/2006 | Levesque | |
| 7,197,286 B2 | 3/2007 | Ode et al. | |
| 7,250,815 B2 | 7/2007 | Taylor et al. | |
| 7,288,988 B2* | 10/2007 | Braithwaite | 330/149 |
| 7,359,685 B2 | 4/2008 | Jafari et al. | |
| 7,466,195 B2* | 12/2008 | Drogi et al. | 330/136 |
| 2002/0053897 A1 | 5/2002 | Kajiwara et al. | |
| 2002/0168949 A1 | 11/2002 | Johannisson et al. | |
| 2003/0017840 A1 | 1/2003 | Katagishi et al. | |
| 2003/0155978 A1 | 8/2003 | Pehlke | |
| 2004/0071225 A1 | 4/2004 | Suzuki et al. | |
| 2004/0162039 A1 | 8/2004 | Marque-Pucheu | |
| 2004/0189378 A1 | 9/2004 | Suzuki et al. | |
| 2004/0263254 A1 | 12/2004 | Tahara et al. | |
| 2005/0064830 A1 | 3/2005 | Grigore | |
| 2005/0122163 A1 | 6/2005 | Chu | |
| 2005/0156662 A1 | 7/2005 | Raghupathy et al. | |
| 2005/0242880 A1 | 11/2005 | Domokos et al. | |
| 2006/0001483 A1 | 1/2006 | Cioffi et al. | |
| 2007/0096806 A1 | 5/2007 | Sorrells et al. | |
| 2007/0184796 A1 | 8/2007 | Drogi et al. | |

FOREIGN PATENT DOCUMENTS

| | | |
|---|---|---|
| WO | WO 95/34128 A1 | 12/1995 |

OTHER PUBLICATIONS

Fergus, T.J., "EDGE Modulation—How Linearization Improves Amplifier Performance," RFDesign, Oct. 2002, 7 pages.

"LF-2.7 GHz RF/IF Gain and Phase Detector, AD8302," Analog Devices, Inc., 2002, [online] [Retrieved on Apr. 5, 2006] Retrieved from the Internet<URL:http://www.analog.com/UploadedFiles/Data_Sheets/797075782AD8302_a.pdf#search='AD8302'>.

McCune, Jr., E.W., "Direct Polar Modulation has the Right Stuff," CommsDesign, Nov. 7, 2005, [online] [Retrieved on Apr. 5, 2006] Retrieved from the Internet<URL:http://www.commsdesign.com/showArticle.jhtm?articleID=173500205>.

Morgan, P., "Highly Integrated Transceiver Enables High-Volume Production of GSM/EDGE Handsets," Silicon Laboratories, Inc., 2005, 6 pages, [online] [Retrieved on Apr. 5, 2006] Retrieved from the Internet<URL:http://www.silabs.com/public/documents/marcom_doc/mcoll/Wireless/Aero_RF_Transceivers/en/Aerolle_Overview.pdf>.

Raab, F. et al., "RF and Microwave Power Amplifier and Transmitter Technologies—Part 3," High Frequency Electronics, Sep. 2003, pp. 34-48.

Raab, F. et al., "RF and Microware Power Amplifier and Transmitter Technologies—Part 4," High Frequency Electronics, Nov. 2003, pp. 38-49.

"SEQ5400—The World's First Single-Chip WEDGE Transceiver," Sequoia Communications, [online] [Retrieved on Apr. 5, 2006] Retrieved from the Internet<URL:http:www.sequoia-communications.com/SEQ5400Data_Sheet.pdf>.

Sowlati, T. et al., "Polar Loop Transmitter," Skyworks™, [online] [Retrieved on Apr. 5, 2006] Retrieved from the Internet<URL:http://paworkshop.ucsd.edu/papers2004/S1_2Polar%20Loop%/020Transmitter.ppt>.

Wilkins, B. et al., "Large Signal Polar Modulation Reduces Heat Dissipation and Increases Battery Life in EDGE Handsets" Feb. 2005, Microwave Product Digest, [online] [Retrieved on Apr. 5, 2006] Retrieved from the Internet<URL:http:www.mpdigest.com/Articles/2005/feb2005/rfmd/Default.htm>.

PCT International Search Report and Written Opinion, PCT/US2009/069960, Feb. 25, 2010, 9 pages.

* cited by examiner

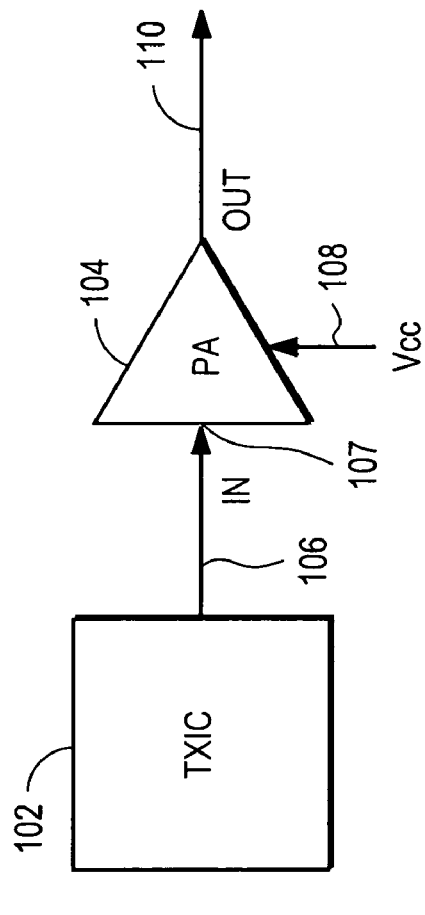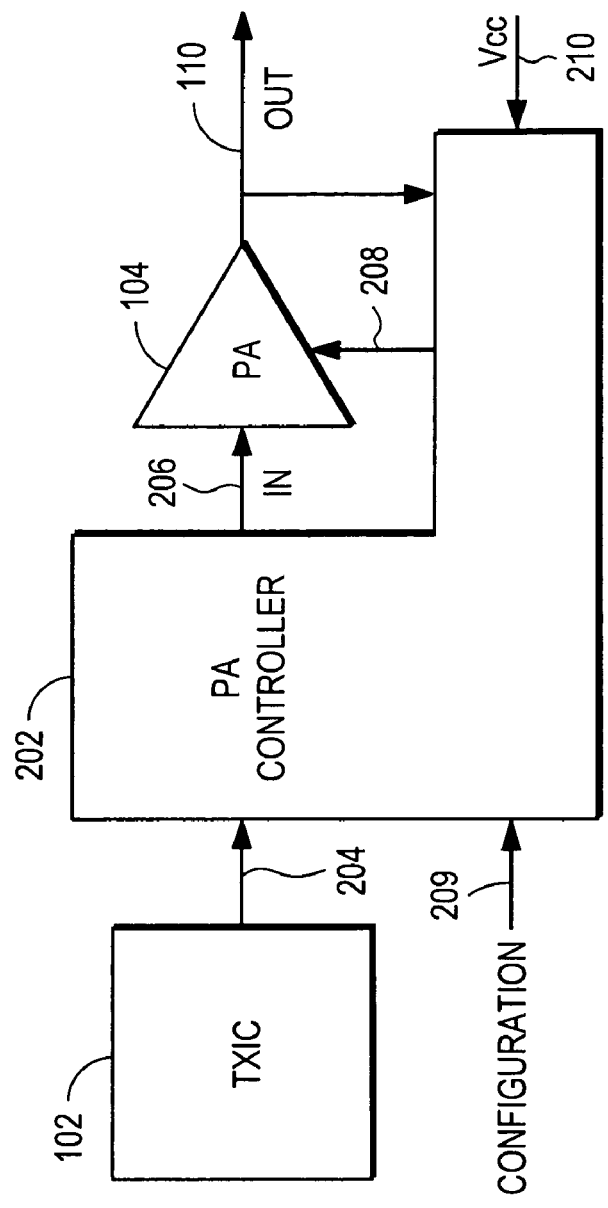
FIG. 1 (PRIOR ART)
FIG. 2

AMPLIFIER COMPRESSION ADJUSTMENT CIRCUIT

BACKGROUND OF THE INVENTION

1. Field of the Invention

The present invention relates to a circuit for controlling RF PAs (Radio Frequency Power Amplifiers), and more specifically, to an RF PA controller circuit that controls the supply voltage of a PA using a closed amplitude control loop with an amplitude correction signal.

2. Description of the Related Art

RF (Radio Frequency) transmitters and RF power amplifiers are widely used in portable electronic devices such as cellular phones, laptop computers, and other electronic devices. RF transmitters and RF power amplifiers are used in these devices to amplify and transmit the RF signals remotely. RF PAs are one of the most significant sources of power consumption in these electronic devices, and their efficiency has a significant impact on the battery life on these portable electronic devices. For example, cellular telephone makers make great efforts to increase the efficiency of the RF PA systems, because the efficiency of the RF PAs is one of the most critical factors determining the battery life of the cellular telephone and its talk time.

FIG. 1 illustrates a conventional RF transmitter circuit, including a transmitter integrated circuit (TXIC) 102 and an external power amplifier (PA) 104. For example, the RF transmitter circuit may be included in a cellular telephone device using one or more cellular telephone standards (modulation techniques) such as UMTS (Universal Mobile Telephony System) or CDMA (Code Division Multiple Access), although the RF transmitter circuit may be included in any other type of RF electronic device. For purposes of illustration only, the RF transmitter circuit will be described herein as a part of a cellular telephone device. The TXIC 102 generates the RF signal 106 to be amplified by the PA 104 and transmitted 110 remotely by an antenna (not shown). For example, the RF signal 106 may be an RF signal modulated by the TXIC 102 according to the UMTS or CDMA standard.

The RF power amplifier 104 in general includes an output transistor (not shown) for its last amplification stage. When an RF modulated signal 106 is amplified by the RF PA 104, the output transistor tends to distort the RF modulated signal 106, resulting in a wider spectral occupancy at the output signal 110 than at the input signal 106. Since the RF spectrum is shared amongst users of the cellular telephone, a wide spectral occupancy is undesirable. Therefore, cellular telephone standards typically regulate the amount of acceptable distortion, thereby requiring that the output transistor fulfill high linearity requirements. In this regard, when the RF input signal 106 is amplitude-modulated, the output transistor of the PA 104 needs to be biased in such a way that it remains linear at the peak power transmitted. This typically results in power being wasted during the off-peak of the amplitude of the RF input signal 106, as the biasing remains fixed for the acceptable distortion at the peak power level.

Certain RF modulation techniques have evolved to require even more spectral efficiency, and thereby forcing the RF PA 104 to sacrifice more efficiency. For instance, while the efficiency at peak power of an output transistor of the PA 104 can be above 60%, when a modulation format such as WCDMA is used, with certain types of coding, the efficiency of the RF PA 104 falls to below 30%. This change in performance is due to the fact that the RF transistor(s) in the RF PA 104 is maintained at an almost fixed bias during the off-peak of the amplitude of the RF input signal 106.

Certain conventional techniques exist to provide efficiency gains in the RF PA 104. One conventional technique is EER (Envelope Elimination and Restoration). The EER technique applies the amplitude signal (not shown in FIG. 1) and the phase signal (not shown in FIG. 1) of the RF input signal 106 separately to 2 ports of the power amplifier 104, i.e., its supply voltage port (Vcc) 108 and its RF input port 107, respectively. However, the EER technique often fails to provide significant efficiency gains, because the supply voltage 108 cannot be varied in an energy-efficient way to accommodate the large variations in the amplitude signal of the RF input signal 106 and thus it fails to provide a substantial energy efficiency gain while maintaining the required linear amplification of the RF signal in the RF PA 104. This is mainly due to the difficulty in realizing a fast, accurate, wide range, and energy efficient voltage converter to drive the supply voltage of the RF PA 104.

The conventional EER technique can function better only if a variable power supply with a very large variation range is used to adjust the supply voltage based on the amplitude signal of the RF input signal 106, while not reducing the efficiency of the RF transmitter by power consumed by the power supply itself. However, the variable power supply, which is typically comprised of a linear regulator (not shown in FIG. 1) that varies its output voltage on a fixed current load such as the PA in linear mode, by principle reduces the supply voltage at constant current and by itself consumes the power resulting from its current multiplied by the voltage drop across the linear regulator when there is a large drop in the amplitude signal of the RF input signal 106. This results in no change in the overall battery power being consumed by the RF transmitter, because any efficiency gained in the RF PA 104 is mostly lost in the linear regulator itself. Variations of the EER technique, such as Envelope Following and other various types of polar modulation methods, likewise fails to result in any significant gain in efficiency in the RF transmitter, because the supply voltage is likewise adjusted based on the amplitude signal of the RF input signal 106 which inherently has large variations and thus has the same deficiencies as described above with respect to conventional EER techniques.

Quite often, the conventional methods of controlling a PA fail to address the amplitude-to-phase re-modulation (AM-to-PM) which occurs in a non-frequency linear device such as a PA. Thus, the conventional methods are not suitable for the common types of PAs for use in common mobile telephony or mobile data systems because the required spectral occupancy performance is compromised by the AM to PM distortion.

Finally, PAs are typically used in conjunction with band pass filters that have a high electric coefficient of quality. These filters are typically of the SAW (surface acoustic wave) type. Due to their high coefficient of quality, the filters exhibit a relatively high group delay. The group delay makes it very difficult for a correction loop to work around the arrangement of the SAW filter and the PA while still meeting the high bandwidth requirements needed for the correction of the AM-to-PM.

Thus, there is a need for an RF PA system that is efficient over a wide variety of modulation techniques and results in a significant net decrease in power consumption by the RF PA system. There is also a need for a PA controller that can correct the AM to PM effects, while not relying on a PA specially designed for low AM to PM at the expense of efficiency. In addition, there is a need for a PA controller that can exclude the use of SAW filters from the path of the correction loop in the PA circuitry.

SUMMARY OF THE INVENTION

One embodiment of the present invention disclosed is a power amplifier controller circuit for controlling a power amplifier based upon an amplitude correction signal or amplitude error signal. The power amplifier receives and amplifies an input signal to the power amplifier and generates an output signal, and the power amplifier controller circuit controls the power amplifier so that it operates in an efficient manner.

The PA controller circuit comprises an amplitude control loop and a phase control loop. The amplitude control loop determines the amplitude correction signal (also referred to herein as the amplitude error signal), which is indicative of the amplitude difference between the amplitude of the input signal and the attenuated amplitude of the output signal, and adjusts the supply voltage to the power amplifier based upon the amplitude correction signal. The phase control loop determines a phase error signal, which indicates a phase difference between phases of the input signal and the output signal, and adjusts the phase of the input signal based upon the phase error signal to match the phase of the output signal. Thus, the phase control loop corrects for unwanted phase modulation introduced by the AM to PM non-ideality of the power amplifier and thus reduces phase distortion generated by the power amplifier.

In a first embodiment of the present invention, the amplitude control loop comprises an amplitude comparator comparing the amplitude of the input signal with an attenuated amplitude of the output signal to generate an amplitude correction signal, and a power supply coupled to receive the amplitude correction signal and generating the adjusted supply voltage provided to the power amplifier based upon the amplitude correction signal. The power supply can be a switched mode power supply. By using the amplitude correction signal to control the supply voltage to the power amplifier, a high-efficiency yet low-bandwidth power supply such as the switched mode power supply may be used to provide the adjusted supply voltage to the power amplifier.

In a second embodiment of the present invention, the amplitude correction signal is split into two or more signals with different frequency ranges and provided respectively to different types of power supplies with different levels of efficiency to generate the adjusted supply voltage provided to the power amplifier. For example, in the second embodiment, the power supplies include a first power supply with a first efficiency and a second power supply with a second efficiency higher than the first efficiency. The first power supply receives a first portion of the amplitude correction signal in a first frequency range and generates a first adjusted supply output based upon the first portion of the amplitude correction signal, and the second power supply receives a second portion of the amplitude correction signal in a second frequency range lower than the first frequency range and generates a second adjusted supply output based upon the second portion of the amplitude correction signal. The first and second adjusted supply outputs are combined to form the adjusted supply voltage provided to the power amplifier. The first power supply can be a linear regulator, and the second power supply can be a switched mode power supply. By dividing the amplitude correction signal into two or more signals with different frequency ranges, the second embodiment of the present invention has the additional advantage that the switched mode power supply may be implemented with even narrower bandwidth as compared to the first embodiment without significantly sacrificing efficiency. A narrower bandwidth power supply or a variable power supply with a smaller range of voltage variation is easier to implement.

In a third embodiment of the present invention, the amplitude control loop further comprises a gain control module receiving the amplitude correction signal to generate a gain control signal, and a variable gain amplifier adjusting the amplitude of the input signal according to the gain control signal. The third embodiment has the advantage that it is possible to operate the power amplifier at any given depth beyond its compression point, resulting in an extra degree of freedom in designing the PA circuit. This is useful in optimizing the efficiency gain versus spectral occupancy performance. By adding the variable gain amplifier, the amplitude of variation of the Vcc or bias voltage to the PA is further reduced, resulting in further significant efficiency gains.

In a fourth embodiment of the present invention, the amplitude control loop includes a variable gain amplifier (VGA) adjusting the amplitude of the input signal, as in the third embodiment, thus providing a second means of adjusting the amplitude of the output of the PA. However, the DC components of the amplitude correction signal are blocked from controlling the VGA. The DC gain of the VGA is controlled separately by a compression control signal, which sets the average gain of the VGA and thus the drive into the PA. Thus, the compression control signal provides a means to control the power amplifier's depth beyond its compression point, allowing control of the tradeoff between efficiency and spectral occupancy performance of the PA.

In a fifth embodiment of the present invention, the amplitude control loop includes a variable gain amplifier (VGA) adjusting the amplitude of the input signal, as in the third embodiment. However, the DC components of the amplitude correction signal are blocked from controlling the power supply. The DC voltage supplied by the power supply is controlled separately by a compression control signal, which sets the average output voltage of the power supply, affecting the compression level of the PA. Thus, in a manner similar to the fourth embodiment, the compression control signal provides a means to control the power amplifier's depth beyond its compression point, allowing control of the tradeoff between efficiency and spectral occupancy performance of the PA.

In a sixth embodiment of the present invention, the amplitude control loop includes a variable gain amplifier (VGA) adjusting the amplitude of the input signal, as in the third embodiment. However, the overall loop gain is controlled by a compression control signal, affecting the compression level of the PA. Thus, in a manner similar to the fourth embodiment, the compression control signal provides a means to control the power amplifier's depth beyond its compression point, allowing control of the tradeoff between efficiency and spectral occupancy performance of the PA.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the present invention can be readily understood by considering the following detailed description in conjunction with the accompanying drawings.

FIG. 1 illustrates a conventional RF transmitter circuit.

FIG. 2 illustrates an RF transmitter circuit including the PA controller in accordance with the present invention.

DETAILED DESCRIPTION OF EMBODIMENTS

Figure 3A:
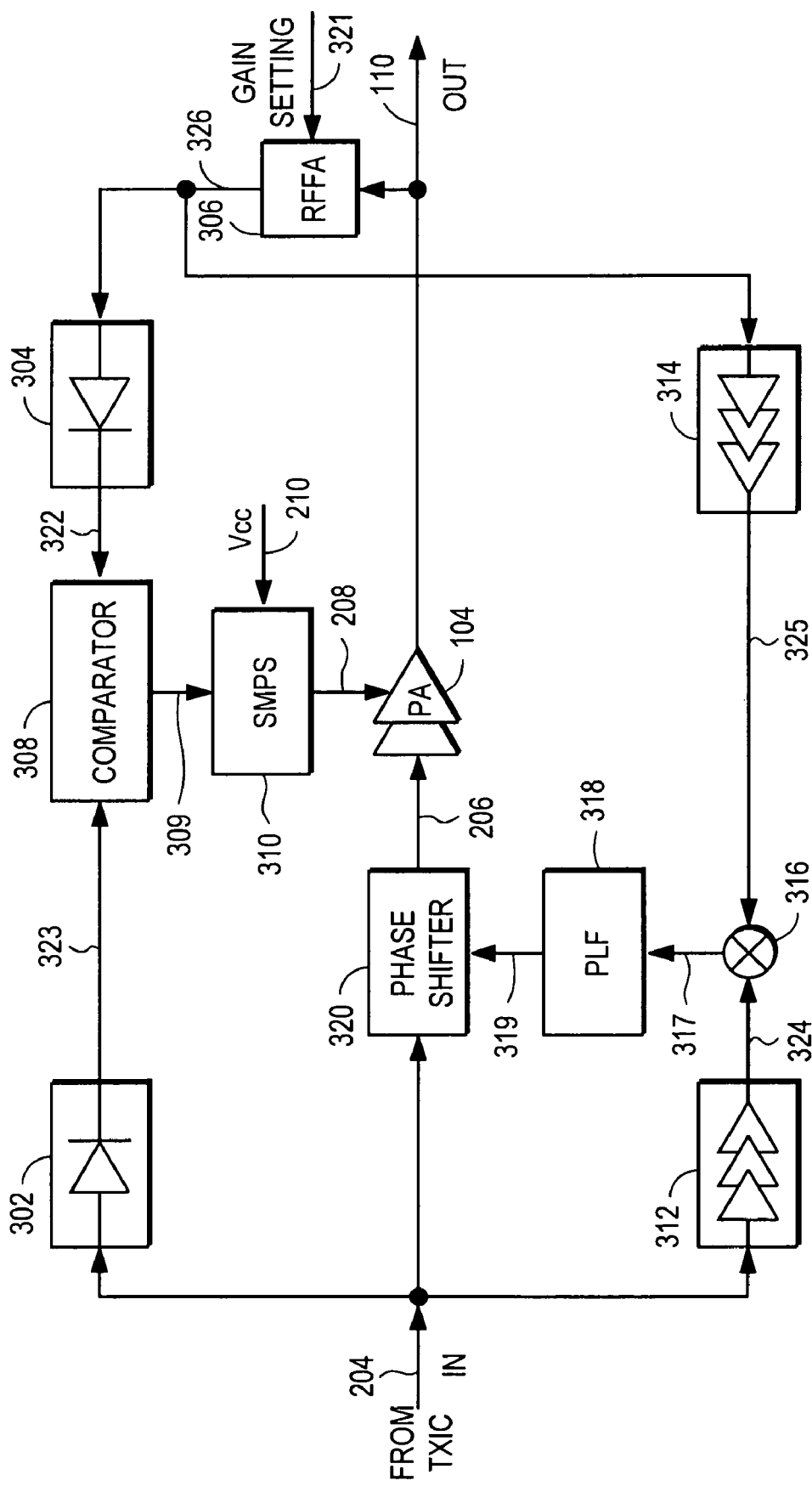
FIG. 3A illustrates an RF power amplifier system, in accordance with a first embodiment of the present invention.

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made to several embodiments of the present invention(s), examples of which are illustrated in the accompanying figures. Wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

FIG. 2 illustrates an RF transmitter circuit including the PA controller 202 in accordance with the present invention. The PA controller 202 is placed between the transmitter IC 102 and the PA 104 to receive the RF signal 204 from the TXIC 102 and provide the RF signal 206 to the PA 104, while controlling the PA 104 by way of an adjusted supply voltage 208. The PA controller 202 is also placed between the power supply line (Vcc) 210 and the PA 104. The PA 104 amplifies the RF signal 206 to output the amplified RF output signal 110, which is also provided as a feedback signal back to the PA controller 202. As will be explained below with reference to FIGS. 3A, 3B, 4A, 4B, 5A, and 5B, the adjusted supply voltage 208 is generated by the PA controller 202 based on an amplitude correction signal (not shown in FIG. 2) indicative of the difference between the attenuated amplitude of the feedback RF output signal 110 and the amplitude of the RF input signal 204. Note that the term "amplitude correction signal" is used herein synonymously with the term "amplitude error signal." The PA controller 202 adjusts the supply voltage (Vcc) 210 based upon the amplitude correction signal to generate the adjusted supply voltage 208 provided to the PA 104, to optimize the efficiency of the PA 104. An advantage of the PA controller 202 is that existing signal connections to the PA 104 and the TXIC 102 need not change when the PA controller 202 is inserted between the TXIC 102, the PA 104, and the supply voltage (Vcc) 210.

The PA controller circuit 202 may also adjust the phase and amplitude of the signal 204 to allow for power control and PA ramping, in accordance with information received through the configuration signals 209. Since the PA controller circuit 202 is aware of the voltage at the output and the current in the power amplifier 104, it can also adjust for load variations at an antenna (not shown herein) that may be used with the PA. If a directional coupler (not shown) is used to feed the attenuated amplitude of the signal 204, the PA controller 202 can adjust the forward power while controlling the PA operation point as it is aware of the voltage and current at node 208.

FIG. 3A illustrates an RF PA system, according to a first embodiment of the present invention. The RF PA system includes the PA 104, and the PA controller 202 including a closed amplitude control loop and a closed phase control loop.

The phase control loop includes two limiters 312, 314, a phase comparator 316, a loop filter (PLF (Phase Loop Filter)) 318, and a phase shifter 320. To achieve stability over all conditions, the phase comparator 316 is of an adequate type with a capture range greater than 2*PI. To achieve this, a combination of adjustable delay elements and frequency dividers may be used. Also a phase sub-ranging system can be used since the dynamic phase variations that the phase correction loop processes are limited in amplitude. A sub-ranging phase control block (not shown) could be one of the constituents of the phase comparator 316 used with this system. Advantages of using sub-ranging in the phase comparator 316 are stability and good noise.

The amplitude control loop includes an adjusted variable attenuator (RFFA (RF Feedback Attenuator)) 306, two matched amplitude detectors 302, 304, a comparator 308, and a switched mode power supply (SMPS) 310. Note that the limiter 312 and the detector 302, and the limiter 314 and the detector 304, can be combined into a single limiter/power detector blocks without altering the functionality of the system.

Referring to FIG. 3A, the phase control loop monitors the RF input signal 204 from the transmitter IC 102 (not shown in FIG. 3A) and compares the phase of the RF input signal 204 with the phase of the output signal 110 of the PA 104 attenuated 326 by the adjusted variable attenuator (RFFA) 306, resulting in a control signal 319 that varies the phase of the RF signal 206 coming out of the phase shifter 320. More specifically, the limiter 312 receives the RF input signal 204 from the TXIC 102 and outputs to the comparator 316 an amplitude limited signal 324 mathematically representative of the phase of its input signal. The limiter 314 also receives the output signal 110 of the PA 104 as attenuated 326 by the adjusted variable attenuator (RFFA) 306, and outputs its phase signal 325 to the comparator 316. The comparator 316 compares the phases of the output signals 324, 325 of the two limiters 312, 314, and generates a phase error signal 317. Note that the term "phase error signal" is used herein synonymously with the term "phase correction signal." The phase error signal 317 is filtered by the loop filter (PLF) 318 to generate the phase control signal 319. The loop filter 318 completes the phase loop and provides the necessary gain, bandwidth limitation, and loop stability required for the phase loop to function properly. The particular loop filter used here can be of any type, and can include multiple integration and derivation stages so as to satisfy the best loop performance. The types of the loop filter may include classical types I, II, and the like. A particularity of this phase loop design is that the group delay through the PA 104 must be taken into account for stability reasons. This is achieved by choosing the proper pole-zero placement in the loop filter and may include delay compensation. The phase control signal 319 is input to the phase shifter 320 to control the shifting of the phase of the input RF signal 206 so that the phase of the output signal 110 dynamically matches the phase of the transmitter signal 204.

The function of the phase control loop is to counteract the AM (Amplitude Modulation) to PM (Phase Modulation) characteristics of the PA 104, which is part of the normal distortion characteristics of transistor-based amplifiers, allowing for the phase of the RF signal to be held constant at the output 110 of the PA 104 compared with the input 204 of the phase shifter 320 and thus reducing phase distortion generated by the PA 104. This phase control loop contributes to linearizing the PA 104 as the AM to PM phase shift of the PA 104 tends to become higher at higher power levels. By limiting the effects of AM to PM of the PA 104, the phase control loop allows the PA 104 to function at higher power levels with less distortion for the output signal 110, thus allowing the use of the PA 104 in more favorable efficiency conditions. In addition, the phase control loop also helps in correcting any additional AM to PM characteristics that the amplitude control loop (described below) may cause. While FIG. 3A shows the phase shifter circuit 320 controlling the input to the PA 104, it is also possible to place the phase shifter 320 at the output of the PA 104 with the same benefits.

Note that the phase control loop is of the error correction only type. In other words, the phase control loop does not modify the phase of the input signal 204 to the PA 104 unless the PA 104 or the amplitude control loop introduces a phase error. Since the noise contributions of the feedback loops affect the overall signal quality of the RF transmitter, an error correction only loop such as the phase control loop shown in FIG. 3A by definition introduces only a small correction, hence has a low noise contribution.

The amplitude control loop is also of the error correction only type, and thus is referred to herein as the amplitude correction loop. Thus, amplitude control loop and amplitude correction loop are used synonymously herein. Referring to FIG. 3A, the amplitude of the RF input signal 204 is monitored through the amplitude detector 302 and compared by the comparator 308 with the amplitude at the output 110 of the PA 104 as attenuated 326 by the adjusted variable attenuator (RFFA) 306, seen through a matched amplitude detector 304. The attenuator 306 is adjusted such that the output 110 of the PA 104 is at a desired level. This can be achieved though programming 321 the variable attenuator (RFFA) 306 by either a digital input to the PA controller 202 or by analog control of the variable attenuator (RFFA) 306. The comparator 308 generates an error signal 309 indicating the difference between the amplitude of the input RF signal 204 and the attenuated amplitude 326 of the output RF signal 110, referred to herein as the "amplitude correction signal" 309. The amplitude correction signal 309 is fed into power supply 310, which is a switch mode power supply (SMPS). The SMPS 310 generates an adjusted supply voltage 208 provided to one or more supply voltage pins of the PA 104 based upon the amplitude correction signal 309. The adjusted supply voltage 208 in essence operates as a bias control signal that controls the operating point of the PA 104.

For a given output power, adjusting the supply voltage 208 of the PA 104 has the effect of varying its gain, as well as changing its efficiency. For a given output power, lowering the supply voltage 208 to the PA 104 provides better efficiency for the PA 104. The adjusted supply voltage 208 of the PA 104 is adjusted to ensure that the PA 104 stays in its most efficient amplification zone. Because adjusting the supply voltage 208 of the PA 104 does make a change to the gain of the PA 104, the output amplitude of the PA 104 changes with the supply voltage 208 from the SMPS 310, and the amplitude control loop can be closed. The principles of such operation can be explained as follows.

When the input to the PA 104 increases, the output of the PA 104 also increases. As the PA 104 stays in its linear region of operation, which corresponds to small input signals, its output will increase linearly with its input. Thus, both inputs to the comparator 308 will rise by the same amount, resulting in no error correction and no change to the supply voltage 208. This is the case when the output power is relatively small and well below the saturation point. As the input power continues to rise at the input of PA 104, there will be a point beyond which the output of the PA 104 will no longer be directly proportional with the input to the PA 104. The amplitude control loop will detect this error between the output and input of the PA 104, and raise the supply voltage to the PA 104 such that the initially-desired output power is delivered, resulting in linear operation of the system, even with a non-linear PA 104.

Figure 7:
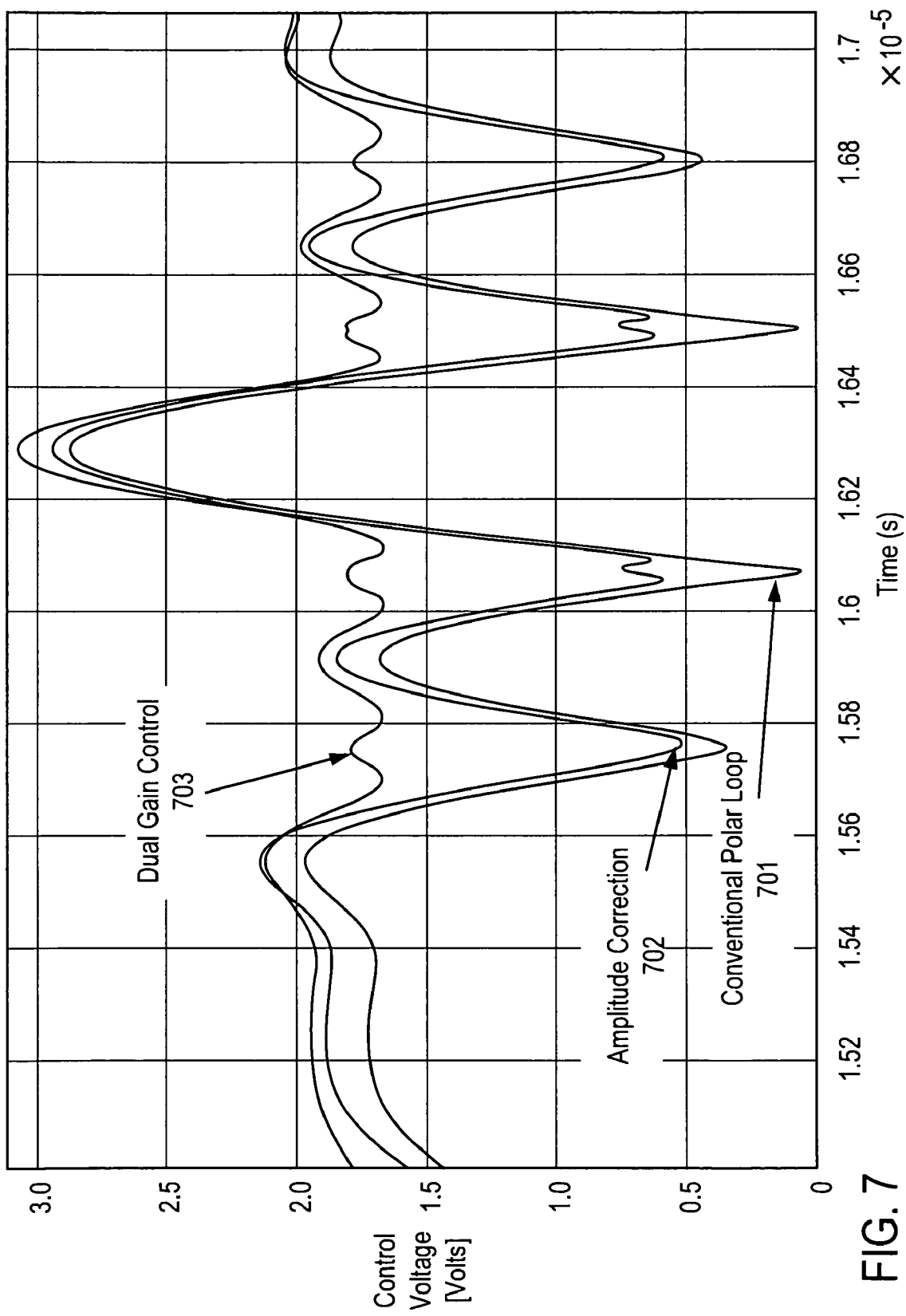
FIG. 7 illustrates simulation results of the changes in the waveform of the supply voltage 208 to the PA 104 corresponding to the conventional polar control method, the first embodiment of FIG. 3A, and the third embodiment of FIG. 5A, for a typical commercial WCDMA PA with 3.4 V nominal supply voltage and WCDMA modulation using 3.84 Mchips per second.

In a practical application, the PA 104 will be fully or partially saturated from its Vcc, for example, the highest 10 dB of its output power range, and as the RF modulation of the RF signal 104 forces the amplitude to vary, the amplitude control loop will only be actively controlling the supply voltage 208 to the PA 104 when the highest powers are required. For lower input power, the amplitude control loop will leave the supply voltage 208 at a fixed level because it detects no gain error, resulting in a fixed gain for the PA 104. The depth beyond compression can be adjusted by setting the level of the input signal 204 and the level of the attenuator 306, as well as the default supply voltage Vcc (not shown in FIG. 3A) to the PA 104. This behavior is illustrated in FIG. 7 where simulation results compare the behavior of the conventional polar architecture (with no feedback) where the supply voltage to the PA swings between 0.1 V and 2.9 V and reaches a minimum value around 0.1 V as shown with curve 701, while the supply voltage 208 to the PA 104 in the first embodiment of FIG. 3A using the amplitude correction signal 309 does not drop below 0.5 V as shown with curve labeled 702. The amplitude swing in the dual gain control method is clearly further reduced as indicated by curve 703, as will be explained in detail below with respect to the third embodiment of the present invention with reference to FIGS. 5A and 5B.

Varying the supply voltage to the PA 104 also results in a phase change. Thus, the phase control loop described above operates in conjunction with the amplitude control loop to maintain the accuracy of RF modulation at the output signal of the PA 104. Note that the phase control loop is also an error correction loop only, and therefore minimally contributes to noise.

Furthermore, the amplitude correction loop has the advantage that an SMPS 310, which does not consume any significant power by itself and thus actually increases the efficiency of the overall RF power amplifier system, can be used to generate the adjusted supply voltage 208 to the PA 104. This is possible because the adjusted supply voltage 208 to the PA 104 is generated by the SMPS 310 based upon the amplitude correction signal 309 which by nature has a much narrower range of variation or fluctuation rather than the actual amplitude of the RF input signal 204 which by nature has a much wider range of variation or fluctuation. An SMPS 310 is easier to implement to follow the amplitude correction signal 309 with a narrow range of variation, but would be more difficult to implement if it had to follow the unmodified amplitude of the RF input signal 204. This is related to the fact that the amplitude signal itself has its fastest variations when the amplitude itself is low. The amplitude correction loop does not need to make any changes to its output when the PA is operating in linear mode. For example, the amplitude correction signal 309 may be only active for the highest 10 dB of the actual output power variation. In contrast, the amplitude signal itself may vary by 40 dB, and varies much faster between −10 dBc to −40 dBc than it does between 0 dBc to −10 dBc. Thus the bandwidth requirements on the SMPS 310, which are coupled with the rate of change of the voltage, are reduced when an amplitude correction signal 309 rather than the amplitude signal itself is used to control the supply of the PA 104. The SMPS 310 does not consume any significant power by itself, and thus does not significantly contribute to usage of the battery power, and actually increases the efficiency of the RF power amplifier system. In contrast, a conventional polar modulation technique typically utilizes the amplitude signal itself to adjust the supply voltage to the PA 104, which prevents the use of an SMPS 310 for wideband RF signals because of the higher bandwidth requirements. Therefore, conventional RF power amplifier control systems typically use linear regulators (rather than an SMPS) to adjust the supply voltage to the PA 104. Such a linear regulator by itself consumes power resulting from its current multiplied by the voltage drop across the linear regulator. When there is a large drop in the amplitude signal, this can result in significant power being lost and results in none or little reduction in the overall battery power being consumed by the RF transmitter. This is because any efficiency gained in the RF PA is mostly lost in the linear regulator itself.

Figure 3B:
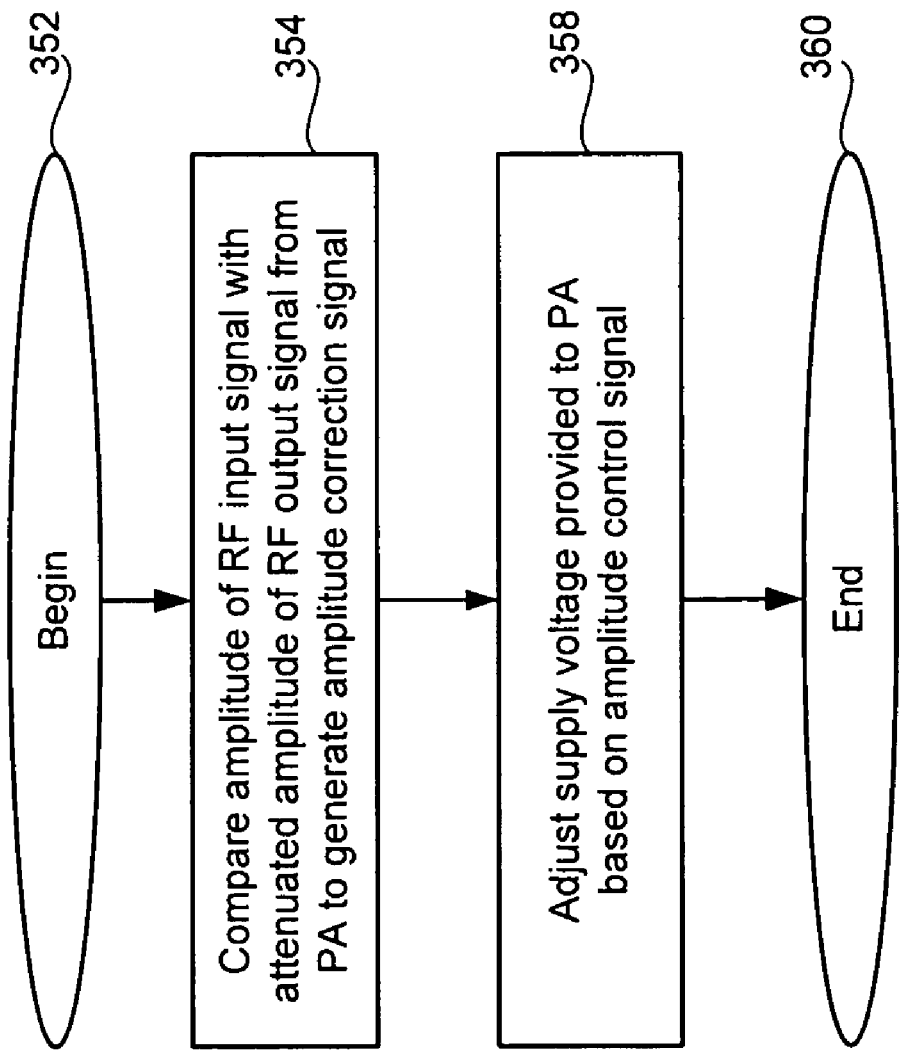
FIG. 3B illustrates a method of controlling the amplitude control loop of a RF PA system, in accordance with the first embodiment of the present invention.

FIG. 3B illustrates a method of controlling the amplitude control loop of a RF PA 104 in an RF PA system, according to the first embodiment of the present invention. Referring to both FIGS. 3A and 3B, as the process begins 352, the comparator 308 compares 354 the amplitude 323 of the RF input signal 204 with the attenuated amplitude 322 of the RF output signal 110 from the PA 104 to generate an amplitude correction signal 309. The SMPS 310 generates 358 an adjusted supply voltage 208 provided to the PA 104 based upon the amplitude correction signal 309, and the process ends 360.

Figure 4A:
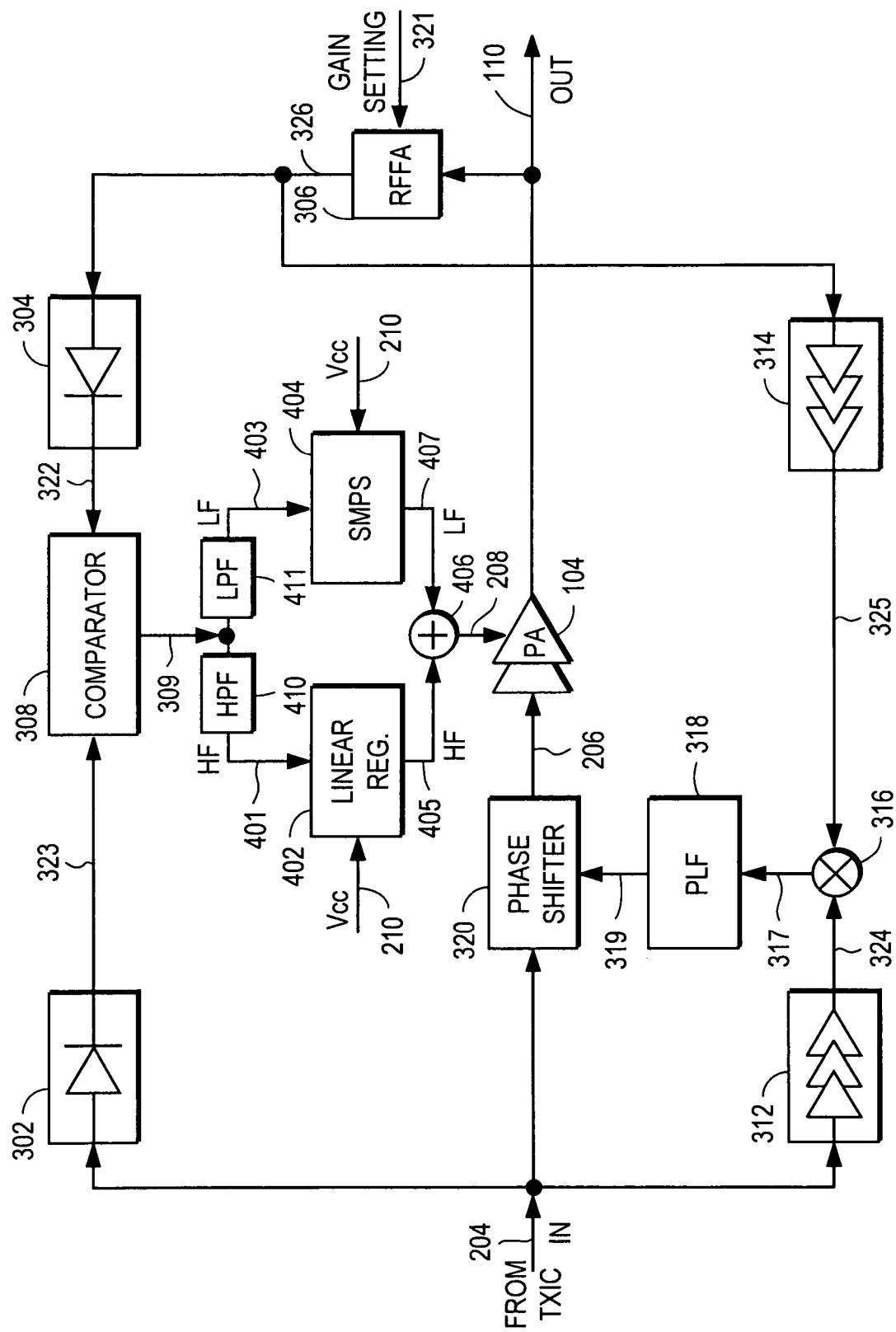
FIG. 4A illustrates an RF power amplifier system, in accordance with a second embodiment of the present invention.

FIG. 4A illustrates an RF PA system, according to a second embodiment of the present invention. The RF PA system illustrated in FIG. 4A is substantially the same as the RF transmitter circuit illustrated in FIG. 3A, except that (i) the amplitude correction signal 309 is split into two signals, a high frequency amplitude correction signal 401 that is fed into a high frequency path including a linear regulator 402 and a low frequency amplitude correction signal 403 that is fed into a low frequency path including an SMPS 404 and that (ii) the outputs of the linear regulator 402 and the SMPS 404 are combined in the adder block 406 to generate the adjusted supply voltage 208 to the PA 104. For example, a simple current adding node, a small, high frequency transformer or other types of active electronic solutions can be used as the adder block 406. Any other types of power combiner circuits may be used as the adder block 406. The high frequency amplitude correction signal 401 is input to the linear regulator 402, which generates the high frequency part 405 of the adjusted supply voltage 208. The low frequency amplitude correction signal 403 is input to the SMPS 404, which generates the low frequency part 407 of the adjusted supply voltage 208. The adder block 406 combines the high frequency part 405 and the low frequency part 407 to generate the adjusted supply voltage 208 to the PA 104 in order to keep the PA 104 in an efficient operation range.

The amplitude correction signal 309 is split into the high frequency amplitude correction signal 401 and the low frequency amplitude correction signal 403 using the high pass filter 410 and the low pass filter 411, respectively. The high frequency amplitude correction signal 401 comprised of components of the amplitude correction signal 309 higher than a predetermined frequency and the low frequency amplitude correction signal 403 is comprised of components of the amplitude correction signal 309 lower than the predetermined frequency. The predetermined frequency used to split the amplitude correction signal 309 can be set at any frequency, but is preferably set at an optimum point where the efficiency of the overall RF transmitter system becomes sufficiently improved. For example, the predetermined frequency can be as low as $1/20^{th}$ of the spectrally occupied bandwidth for the RF signal. In other embodiments, the predetermined frequency may not be fixed but may be adjusted dynamically to achieve optimum performance of the RF transmitter system.

Power consumed by the linear regulator 401 from a power source such as a battery (not shown) for a given control voltage 208 on the PA 104 can be approximated as follows:

$$P_{bat} \approx I_{pa} \times V_{pa} + \mathit{Effl} \times (Vcc - V_{pa}) \times I_{pa}$$

$$\approx \mathit{Effl} \times Vcc \times I_{pa}$$

with Effl=1.05, which is sufficiently close to 1 to allow for this approximation, where $P_{bat}$ is the power from the battery, $I_{pa}$ is the input current to the PA 104, $V_{pa}$ is the input supply voltage to the PA 104, and Vcc is the supply voltage of the battery. In addition, power consumed by the SMPS 404 from a power source such as a battery (not shown) for a given control voltage 208 on the PA 104 can be approximated as follows:

$$P_{bat} = Effs * I_{pa} * V_{pa}$$

with Effs=1.1, and the efficiency of the switch (not shown) in the SMPS generally exceeding 90%.

If the average input voltage $V_{pa}$ to the PA 104 is significantly lower than supply voltage Vcc of the battery, the SMPS 404 achieves much lower power consumption. While the linear regulator 402 is generally less efficient than the SMPS 404, the linear regulator 402 processing the high frequency part 401 of the amplitude correction signal 309 does not make the overall RF PA system inefficient in any significant way, because most of the energy of the amplitude correction signal 309 is contained in the low frequency part 403 rather than the high frequency part 401. This is explained below with reference to FIGS. 8 and 9.

Using both a high efficiency path comprised of the SMPS 404 carrying the low frequency portion 403 of the amplitude correction signal 309 and a low efficiency path comprised of the linear regulator 402 carrying the high frequency portion 401 of the amplitude correction signal 309 has the advantage that it is possible to use an SMPS 404 with a limited frequency response. In other words, the SMPS 404 need not accommodate for very high frequencies but just accommodates for a limited range of lower frequencies of the amplitude correction signal 309, making the SMPS 404 much easier and more cost-effective to implement. Combining the SMPS 404 with the linear regulator 402 enables high bandwidths of operation accommodating for full frequency ranges of the amplitude correction signal 309 without sacrificing the overall efficiency of the RF PA system in any significant way, since most of the energy of the amplitude correction signal 309 that is contained in the low frequency part 403 of the amplitude correction signal 309 is processed by the more efficient SMPS 404 rather than the less efficient linear regulator 402.

For example, Table 1 below illustrates the percentage of energy contained in the various frequency ranges in a hypothetical simple 4QAM (Quadrature Amplitude Modulation) signal used in WCDMA cellular telephones and the overall efficiency that can be expected to be achieved by the RF transmitter according to the embodiment of FIG. 4A with the assumptions of the particular operating conditions as illustrated in Table 1. The combined amplitude and phase spectrum is 4 MHz wide.

TABLE 1

| 4QAM Signal PA current = 100 mA Adjusted supply voltage 208 to PA = 60% of Vbat on average | Below 100 KHz (Through SMPS 404) | Above 100 KHz (up to 40 MHz) (Through Linear Regulator 402) | All Frequencies |
|---|---|---|---|
| Percentage of energy in adjusted supply voltage 208 to PA 104 in designated bandwidth | 83% | 17% | 100% |
| Efficiency of conversion at 60% of Vbat | 90% | 57% | 71% |
| Current from battery | 66.66 mA | 17.85 mA | 84.51 mA |
| Power supply system efficiency using high and low bandwidth paths | | 71% | |

Despite the extremely narrow bandwidth (100 KHz) of the SMPS 404 shown in the example of Table 1, 71% efficiency in the RF power amplifier supply system according to the embodiment of FIG. 4A can be expected under the above hypothetical conditions by using a 90% efficient SMPS 404 combined with a 57% efficient linear regulator 402. This is a very significant improvement over conventional PA controller systems that would typically use only a linear regulator under the same operating conditions and thus would be only 57% efficient. By using an SMPS 404 with an increased bandwidth, it is possible to improve the efficiency of the RF power amplifier even further.

Figure 4B:
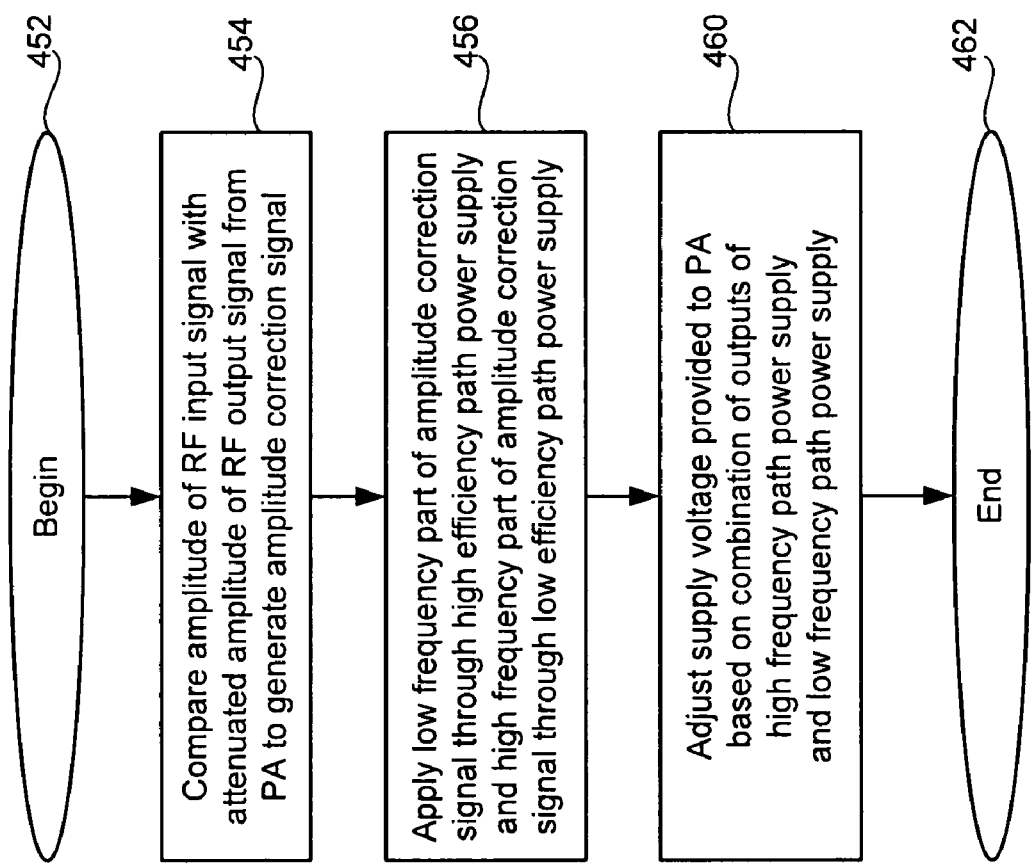
FIG. 4B illustrates a method of controlling the amplitude control loop of a RF PA system, in accordance with the second embodiment of the present invention.

FIG. 4B illustrates a method of controlling the amplitude control loop of a RF PA in an RF PA system, in accordance with the second embodiment of the present invention. FIG. 4B is explained in conjunction with FIG. 4A. Referring to both FIGS. 4A and 4B, as the process begins 452, the comparator 308 compares 454 the amplitude 323 of the RF input signal 204 with the attenuated amplitude 322 of the RF output signal 110 from the PA 104 to generate an amplitude correction signal 309. The low frequency part 403 of the amplitude correction signal 309 is applied 456 to the high efficiency SMPS 404 while the high frequency part 401 of the amplitude correction signal 309 is applied 456 to the low efficiency linear regulator 402. The supply voltage 208 to the PA 104 is adjusted 460 based upon the combination of the outputs 407, 405 of the high efficiency SMPS 404 and the low efficiency linear regulator 402, and the process ends 462.

Figure 5A:
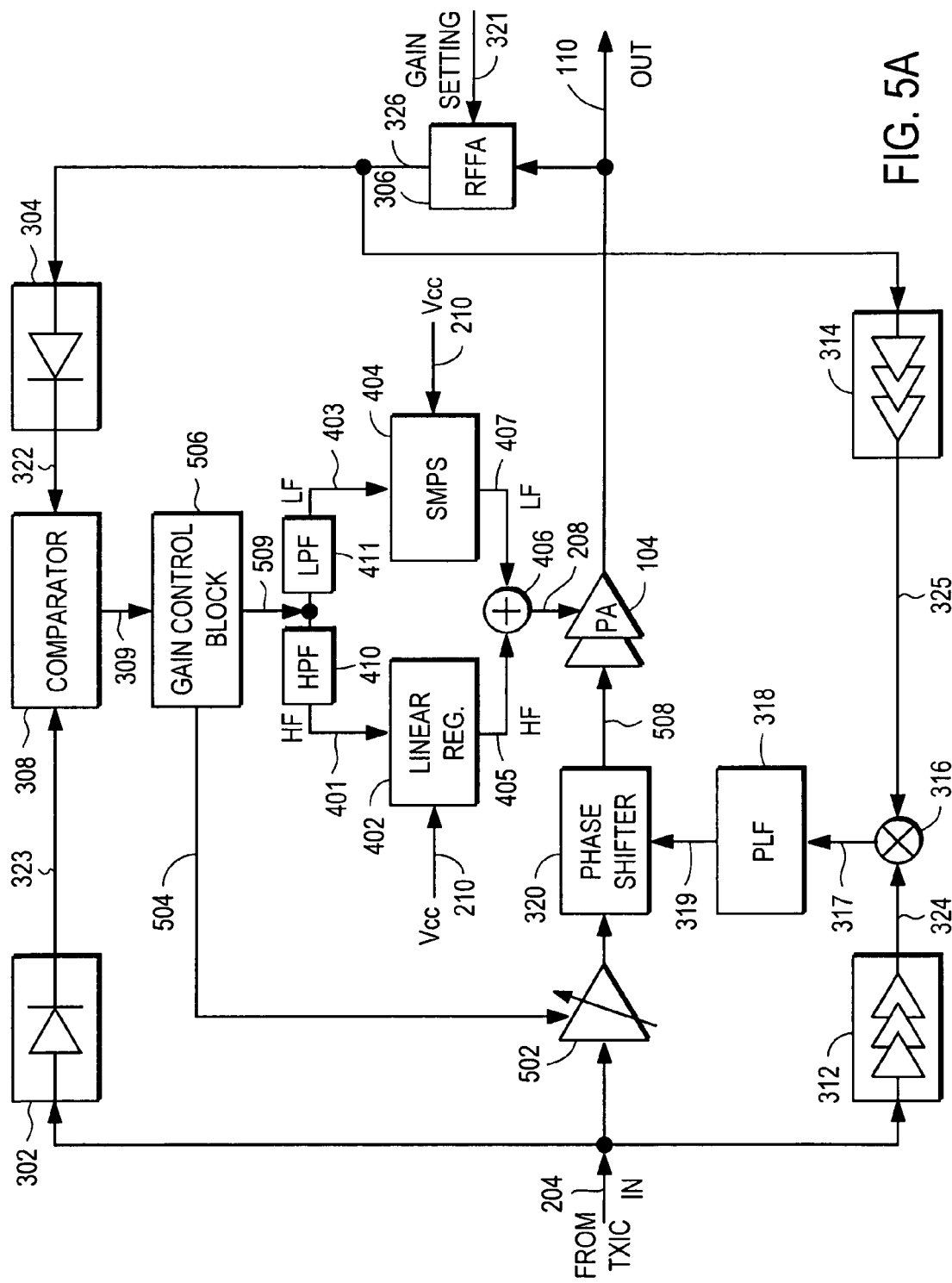
FIG. 5A illustrates an RF power amplifier system, in accordance with a third embodiment of the present invention.

FIG. 5A illustrates an RF PA system, according to a third embodiment of the present invention. The RF transmitter system illustrated in FIG. 5A is substantially the same as the RF transmitter system illustrated in FIG. 4A, except that the gain control block 506 and the variable gain amplifier 502 are added to provide an additional means to control the efficiency of the PA 104 and the overall RF transmitter system. Although the third embodiment of FIG. 5A is illustrated herein as an improvement to the second embodiment of FIG. 4A, note that the same concepts of the third embodiment of FIG. 5A can also be used to improve the first embodiment of FIG. 3A.

More specifically, the gain control block 506 receives the amplitude correction signal 309 and adjusts the gain of the variable gain amplifier 502 based upon the amplitude correction signal 309, as well as passing the low frequency and high frequency parts 403, 401 of the amplitude correction signal 309 to the SMPS 404 and the linear regulator 402, respectively, to generate the adjusted supply voltage 208 as explained above with reference to FIG. 4A. By monitoring the amplitude of the amplitude correction signal 309 input to the gain control block 506, a control signal 504 is created to further compensate the gain of the variable gain amplifier 502 before the PA 104. This arrangement allows the use of even lower bandwidth for the PA controller system as compared to that of the second embodiment described in FIG. 4A above. Also the programmability of the output power can now be entirely left to the PA controller 202, while in the embodiment of FIG. 4A changing the output power required a change in gain in the transmitter IC 102.

With the addition of the variable gain amplifier 502 and the gain control block 506, it is possible to use the PA 104 at any given depth beyond its compression point. The term "depth beyond compression" is used herein to refer to the difference between the averaged input compression level of the PA 104 and the actual averaged input power at the PA 104. For instance, when the peak output power is required, the input to the PA 104 can be overdriven by 10 dB beyond the 1 dB compression point of the PA 104. It is also possible to adjust the supply voltage of the PA 104 at the instant when the peak power is required, such that the 1 dB compression point is set higher and it is only necessary to overdrive the PA 104 input by 3 dB to obtain the same output peak power. A dynamic adjustment of both the input level and the supply voltage allows this loop system to reduce significantly further the amplitude of the control voltage 208.

In the embodiment of FIG. 5A, the independent programming of gain and compression point by the closed amplitude control loop also makes it possible to reduce the amount of high frequency energy that the power supply system (linear regulator) has to deliver to the PA 104. This can be done by having the variable gain amplifier 502 correct for some of the gain error at a higher speed than the Vcc control loop (closed on node 208) can do, thus reducing the amount of correction that is to be done by the low efficiency, high frequency branch (linear regulator 401). Thus, the bandwidth of the signals at nodes 208 and 504 can be made to be significantly different. Since only a small fraction of the energy resides at high frequencies, there is only a small penalty in efficiency for reducing the bandwidth of the control at node 208 relative to the bandwidth at node 504. The ratio of the two active bandwidths is part of the design trade-off for the whole system. The gain control block 506 adjusts the compression point while the gain loop remains closed through the variable gain amplifier 502. This allows the RF controller system to search an optimum depth beyond compression (as measured by the absolute value of the amplitude correction signal 309 or alternatively by the averaged value of the gain control 504) and efficiency with less effect on the resulting signal quality. The search for the optimum depth beyond compression can be made by a slow control loop which monitors the absolute value of the amplitude correction signal 309, as well as its derivative. Another alternative is to monitor the averaged value of the gain control signal 504. In order to control the relative action of both amplitude controls 504 and 208, and in particular control the maximum voltage at node 208, a control system for the compression level of the variable gain amplifier 502 can be implemented. Because in the embodiment of FIG. 5A both the supply voltage 208 to the PA 104 and the input 508 to the PA 104 can be adjusted, this embodiment inherently offers greater flexibility in design by exploiting two sources of signal information for control. This allows to further reduce the amplitude of the variation of the voltage control signal 208, as shown on FIG. 7, where the voltage with the smallest variation is the signal labeled 703, corresponding to this third embodiment of FIG. 5A.

In addition, the third embodiment of FIG. 5A is also well suited to process directly a polar representation of the RF signal. In this case, an amplitude signal from the TXIC 102 would couple to the amplitude detector 302 and a phase only signal from the TXIC 102 would be coupled to the variable gain amplifier 502 and the limiter 312.

Figure 5B:
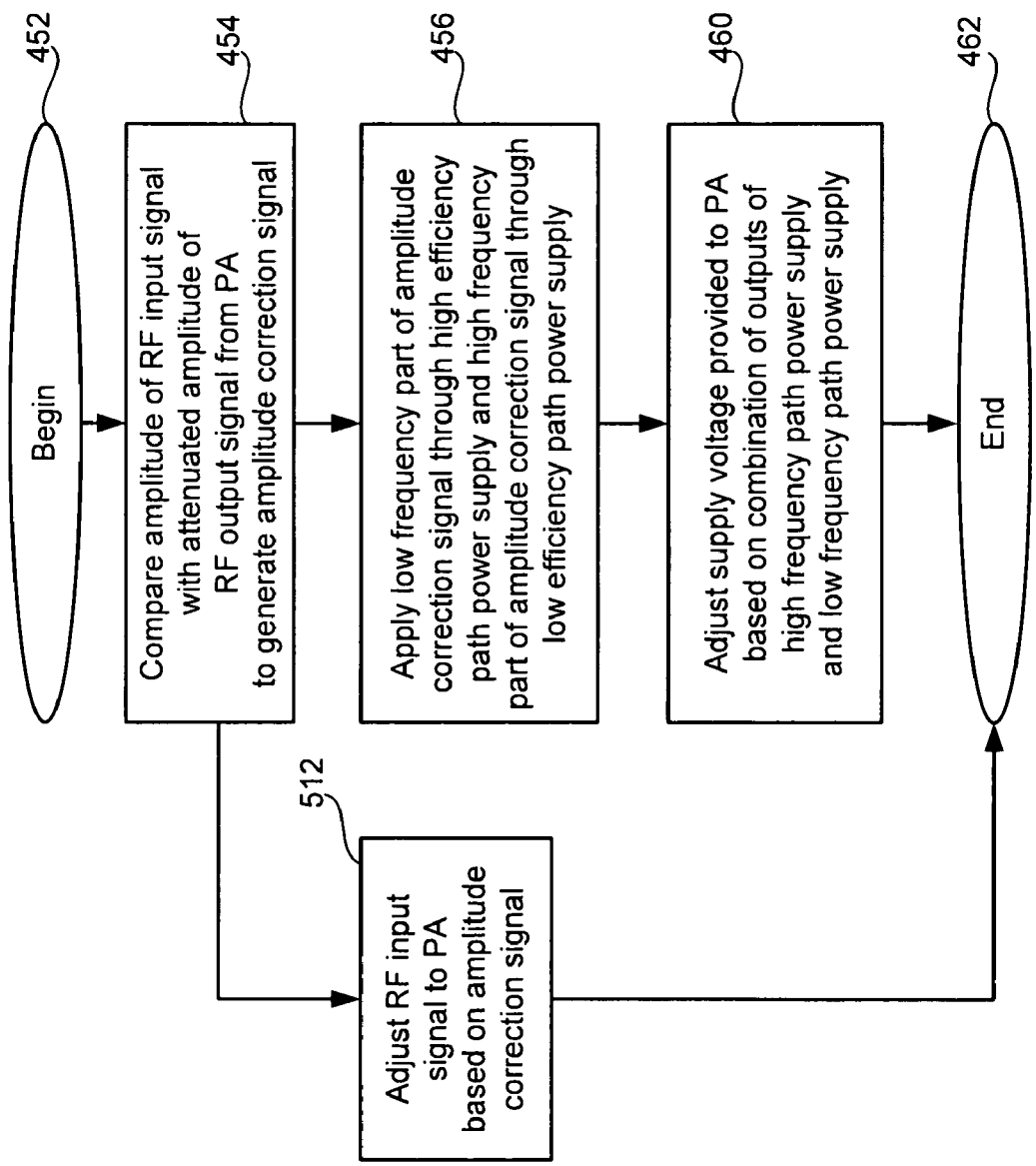
FIG. 5B illustrates a method of controlling the amplitude control loop of a RF PA system, in accordance with the third embodiment of the present invention.

FIG. 5B illustrates a method of controlling the amplitude control loop of a RF PA in an RF transmitter system, in accordance with the third embodiment of the present invention. The method illustrated in FIG. 5B is substantially the same as the method illustrated in FIG. 4B, except that step 512 is added. In step 512, the input signal 508 to the PA 104 is adjusted, by use of a variable gain amplifier 502, based upon the amplitude correction signal 309. Therefore, the method of FIG. 5B is provided with an additional means for controlling the efficiency of the PA 104 and the overall RF PA system.

Figure 6:
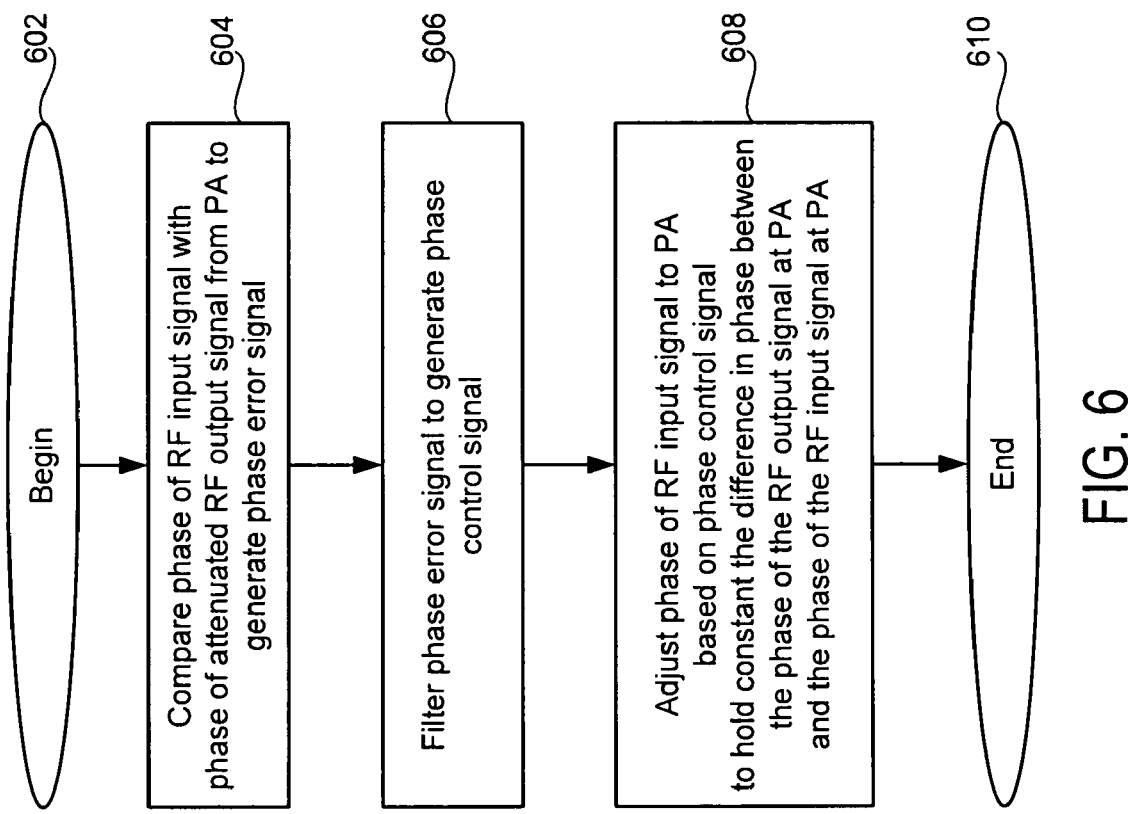
FIG. 6 illustrates a method of controlling the phase control loop of a RF power amplifier system in accordance with the present invention.

FIG. 6 illustrates a method of controlling the phase control loop of a RF PA in an RF PA system in accordance with the present invention. The phase control method of FIG. 6 can be used with any one of the methods of controlling the amplitude correction loops described in FIGS. 3B, 4B, and 5B, as shown in FIGS. 3A, 4A, and 5A. The method of FIG. 6 will be explained in conjunction with FIGS. 3A, 4A, and 5A. As the process begins 602, the comparator 316 compares 604 the phase of the RF input signal 204 with the phase of the attenuated RF output signal 326 from the PA 104 to generate the phase error signal 317. The phase error signal 316 is filtered 606 by the loop filter (PLF) 318 to generate the phase control signal 319. The phase of the input RF signal 204 is shifted 608 based upon the phase control signal 319 so that the difference between the phase of the input signal 204 and the phase of the output RF signal 110 is held constant, and the process ends 610.

FIG. 7 illustrates simulation results of the changes in the waveform of the supply voltage 208 to the PA corresponding to the conventional polar control method, the first embodiment of FIG. 3A, and the third embodiment of FIG. 5A, for a typical commercial WCDMA PA with 3.4 V nominal supply voltage and WCDMA modulation using 3.84 Mchips per second. As explained previously, the adjusted supply voltage 208 generated by a conventional polar system as indicated by curve 701 varies the most with wide fluctuations, the adjusted supply voltage 208 generated by the first embodiment of FIG. 3A as indicated by curve 702 varies less than the curve 701, and the adjusted supply voltage 703 generated by the third embodiment of FIG. 5A varies the least with only a little fluctuation.

Figure 8:
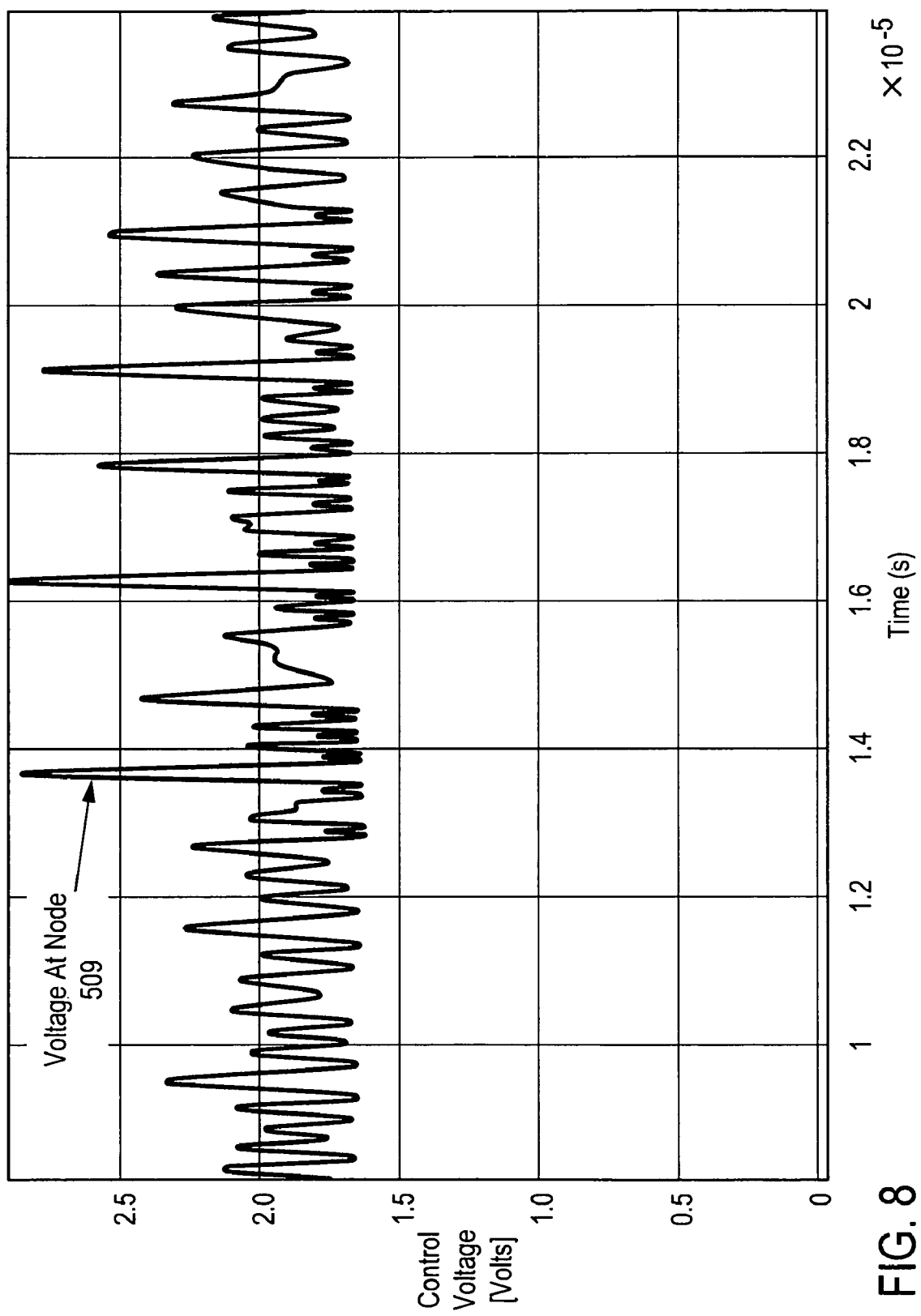
FIG. 8 illustrates the simulation results of an example of a time domain waveform present at the node 509 of FIG. 5A for a typical commercial WCDMA PA with 3.4 V nominal supply voltage and WCDMA modulation using 3.84 Mchips per second.
Figure 9:
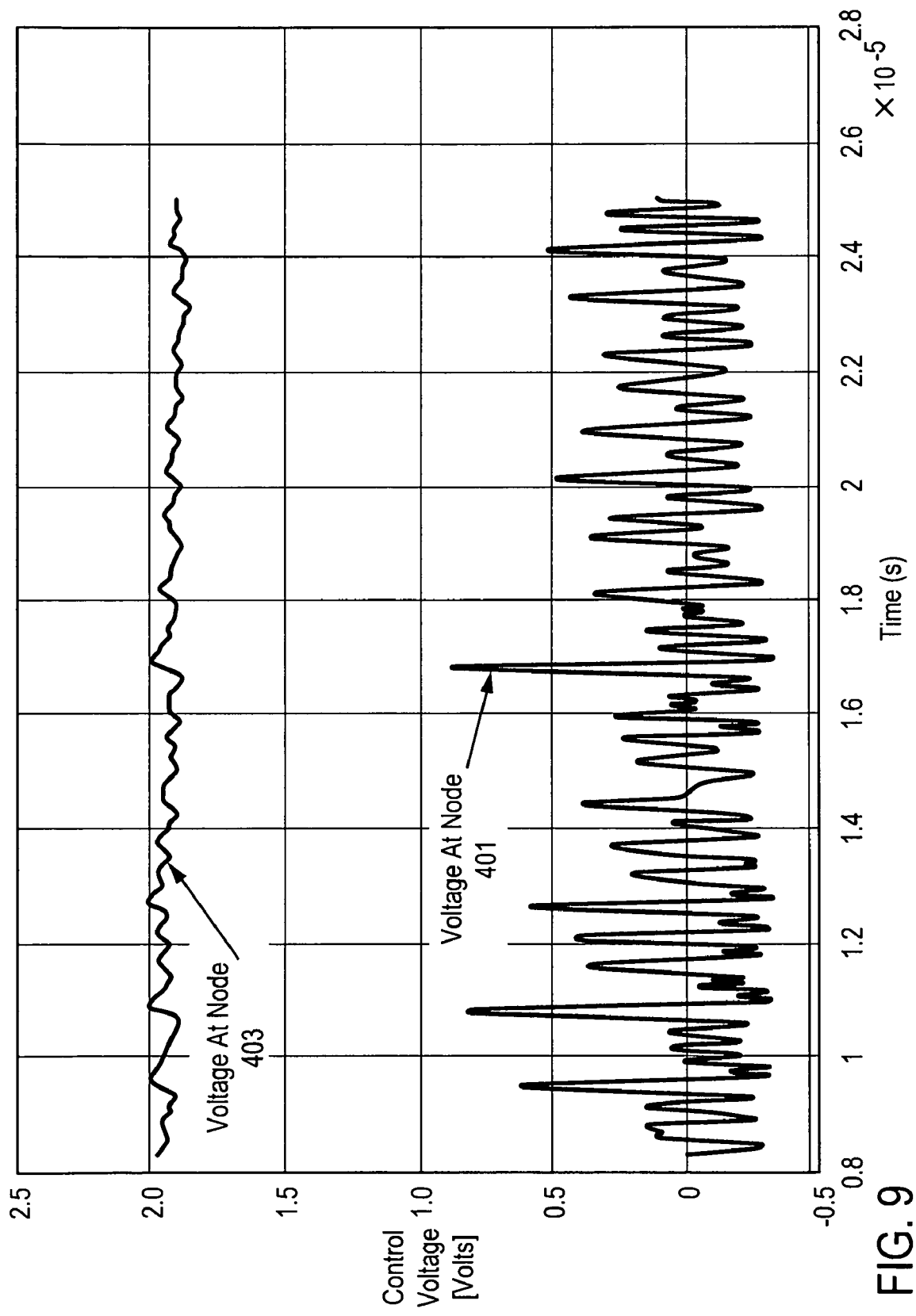
FIG. 9 illustrates the simulation results of an example of a time domain waveform present at nodes 401 and 403 of FIG. 5A for a typical commercial WCDMA PA with 3.4 V nominal supply voltage and WCDMA modulation using 3.84 Mchips per second.

FIG. 8 illustrates the simulation results of an example of a time domain waveform present at node 509 (which voltage would be the same as the voltage at node 309) of FIG. 5A, and FIG. 9 illustrates the simulation results of an example of a time domain waveform present at nodes 401 and 403 of FIG. 5A, both for a typical commercial WCDMA PA with 3.4 V nominal supply voltage and WCDMA modulation using 3.84 Mchips per second. The loop voltage versus time on FIG. 8 shows that the loops maintain a voltage much lower than 2.5 V most of the time, except for some short instants. This is due to the signal's amplitude characteristics which require high peaks but a much lower average. In FIG. 9, the voltages 401 and 403 are shown. They correspond to the voltage 309 (or 509) after filtering by a 100 kHz high pass filter 410 and a 100 kHz low pass filter 411, respectively. It can be seen that the low pass filtered signal 403 is almost a DC signal of value 1.9 V, while the high pass filtered signal 401 is a band limited waveform having a low DC value and an rms value of only 0.2V. If the 1.9V is generated with an efficiency of 90% by an easy-to-realize low output bandwidth SMPS 404, and the 0.2V is generated with an efficiency of 60% using a linear amplifier 402, the signal 309 can be generated with a combined efficiency of $(1.9+0.2)/(1.9/0.9+0.2/0.6)=87.5\%$. This is much better than generating the signal 309 using a linear regulator with an average efficiency of $(1.9/3.4)/1.05=53\%$. While it should be understood that the calculations presented herein are engineering approximations, the potential benefit in battery life is clearly apparent through this example.

Figure 10A:
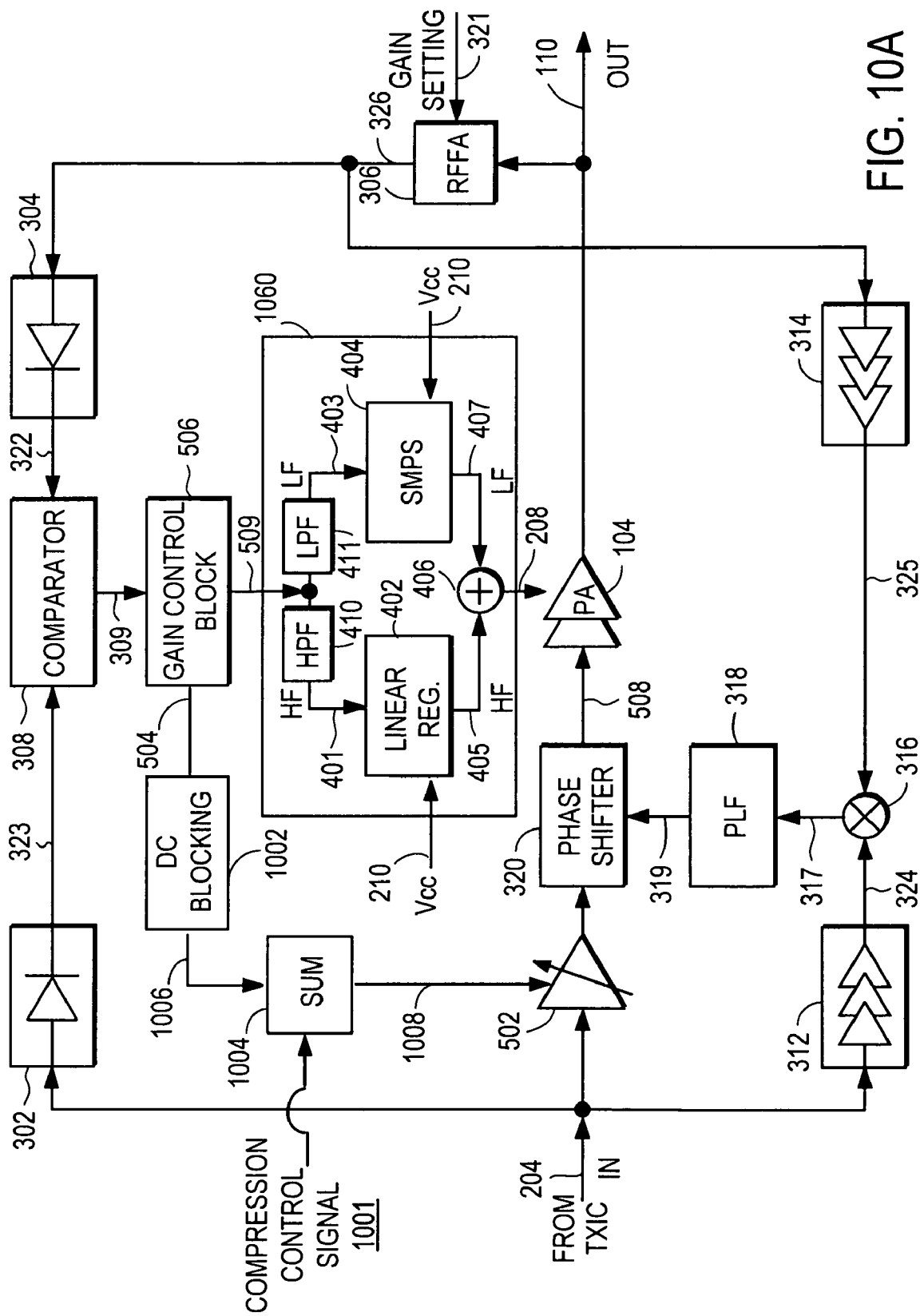
FIG. 10A illustrates an RF power amplifier system, in accordance with a fourth embodiment of the present invention.

FIG. 10A illustrates an RF power amplifier system, in accordance with a fourth embodiment of the present invention. The RF PA system illustrated in FIG. 10A is substantially the same as the RF PA system illustrated in FIG. 5A, except that it additionally includes a DC blocking module 1002 and a summing module 1004, and additionally receives a compression control signal 1001.

The DC blocking module 1002 is added in series with the VGA gain control signal 504 and filters out (blocks) DC components of the VGA gain control signal 504 to output primarily the AC components 1006 of the VGA control signal 504. The compression control signal 1001 is a DC or low frequency signal that is used to set the average gain of the VGA 502. The AC components 1006 of the VGA control signal 504 and the compression control signal 1001 are summed in the summing module 1004 to generate a modified VGA control signal 1008. The modified VGA control signal 1008 sets the gain of the VGA 502.

Thus, the gain control block 506 adjusts the gain of the VGA 502 with the VGA gain control line 1006 based upon only the AC components of the amplitude correction signal 309. The AC components 1006 passed by the DC blocking module (also referred to herein as a frequency blocking module or frequency selection module) 1002 include sufficiently low frequencies to ensure that the VGA 502 contributes to correcting the amplitude error of the PA 104 even at low frequencies. The average gain of the VGA 502 is set by the compression control signal 1001, which is added to the AC components 1006 of the VGA gain control signal 504. By increasing the level of the compression control signal 1001, the VGA 502 increases its average gain and thus increases its drive into the PA 104. Increased drive into PA 104 results in the PA 104 operating in a higher depth beyond compression with improved power efficiency, with a tradeoff in spectral occupancy performance due to increased amplitude of the variation of the supply voltage 208 to the PA 104.

Although the fourth embodiment of FIG. 10A is illustrated herein as an improvement to the third embodiment of FIG. 5A with multiple power supplies 402, 404 generating the supply voltage 208 to the PA 104, note that the concepts of the fourth embodiment of FIG. 10A can also be used to in a RF PA system with a single power supply controlling the supply voltage 208 to the PA 104.

Figure 10B:
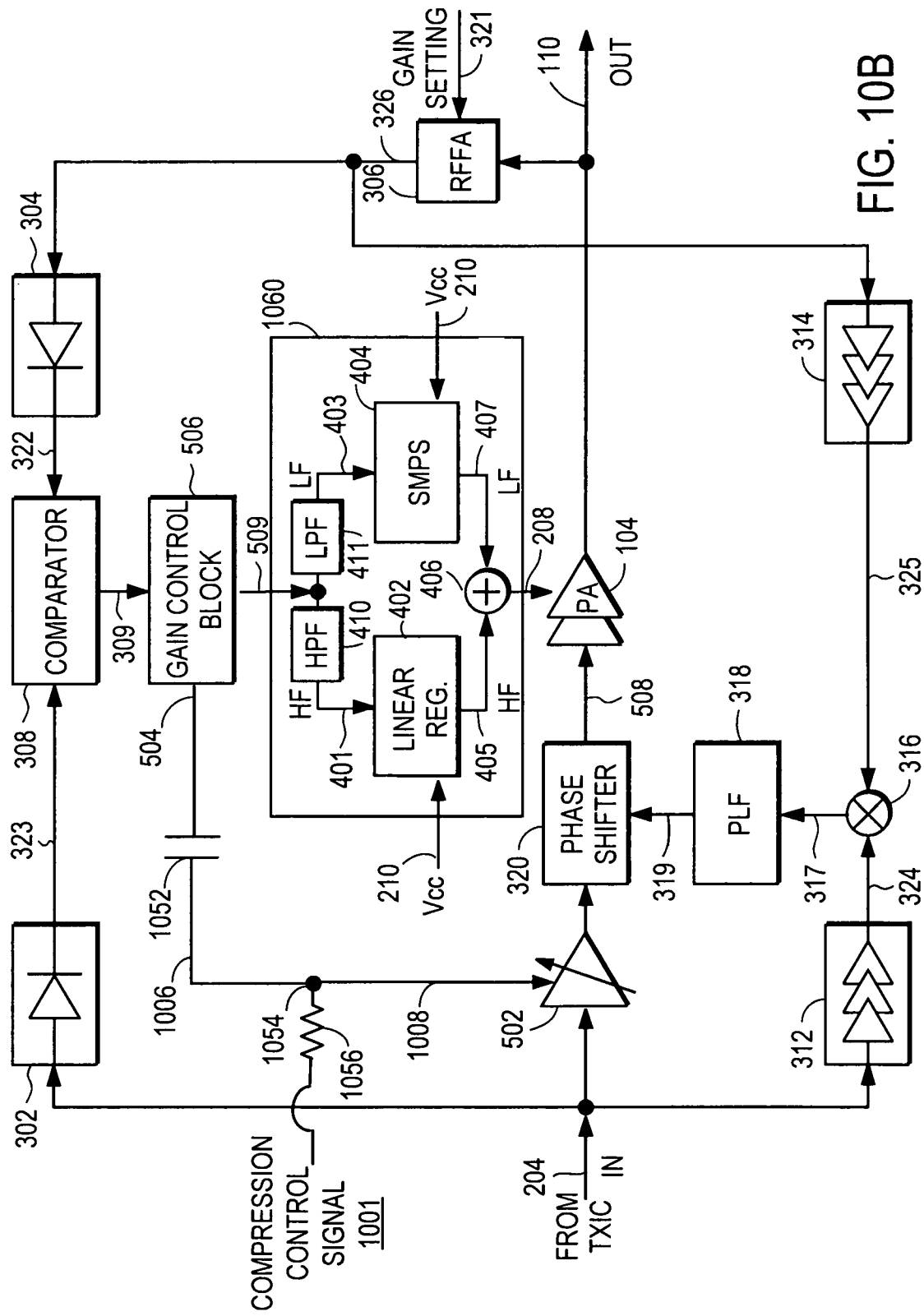
FIG. 10B illustrates an implementation example of the RF power amplifier system of FIG. 10A, in accordance with the fourth embodiment of the present invention.

FIG. 10B illustrates an implementation example of the RF power amplifier system of FIG. 10A, in accordance with the fourth embodiment of the present invention. The example circuitry of FIG. 10B is substantially the same as the RF PA system of FIG. 10A, except that the DC blocking module 1002 of FIG. 10A is implemented as a capacitor 1052, a resistor 1056 is added in series to the compression control signal 1001, and the summing block 1004 is implemented as a simple current summing node 1054.

The capacitor 1052 blocks the DC components of the VGA gain control signal 504 to output primarily the AC components 1006 of the VGA control signal 504. The compression control signal 1001 imposes a DC level to control the average gain of the VGA 502. The combination of resistor 1056 and capacitor 1052 forms a frequency-selective network that passes frequencies above $F=1/(2\pi RC)$ from the VGA gain control signal 504 and passes frequencies below $F=1/(2\pi RC)$ from the compression control signal 1001, where R is the resistance value of the resistor 1056 and C is the capacitance value of the capacitor 1052. For example, the capacitance value C of capacitor 1052 may be 1 nF and the resistance value R of resistor 1056 may be 5.3 KOhms, resulting in F=30 KHz. The AC components 1006 above the frequency F of the VGA control signal 504 and the DC frequency components below the frequency F of the compression control signal 1001 are summed in the summing node 1054 to generate a modified VGA control signal 1008. The modified VGA control signal 1008 sets the gain of the VGA 502.

Thus, the gain control block 506 adjusts the gain of the VGA 502 with the VGA gain control line 1006 based upon only the AC components of the amplitude correction signal 309 above frequency F. The average gain of the VGA 502 is set by the DC components of the compression control signal 1001, which are superimposed on the AC components 1006 of the VGA gain control signal 504. By increasing the level of the compression control signal 1001, the VGA 502 increases its average gain and thus increases its drive into the PA 104.

Figure 10C:
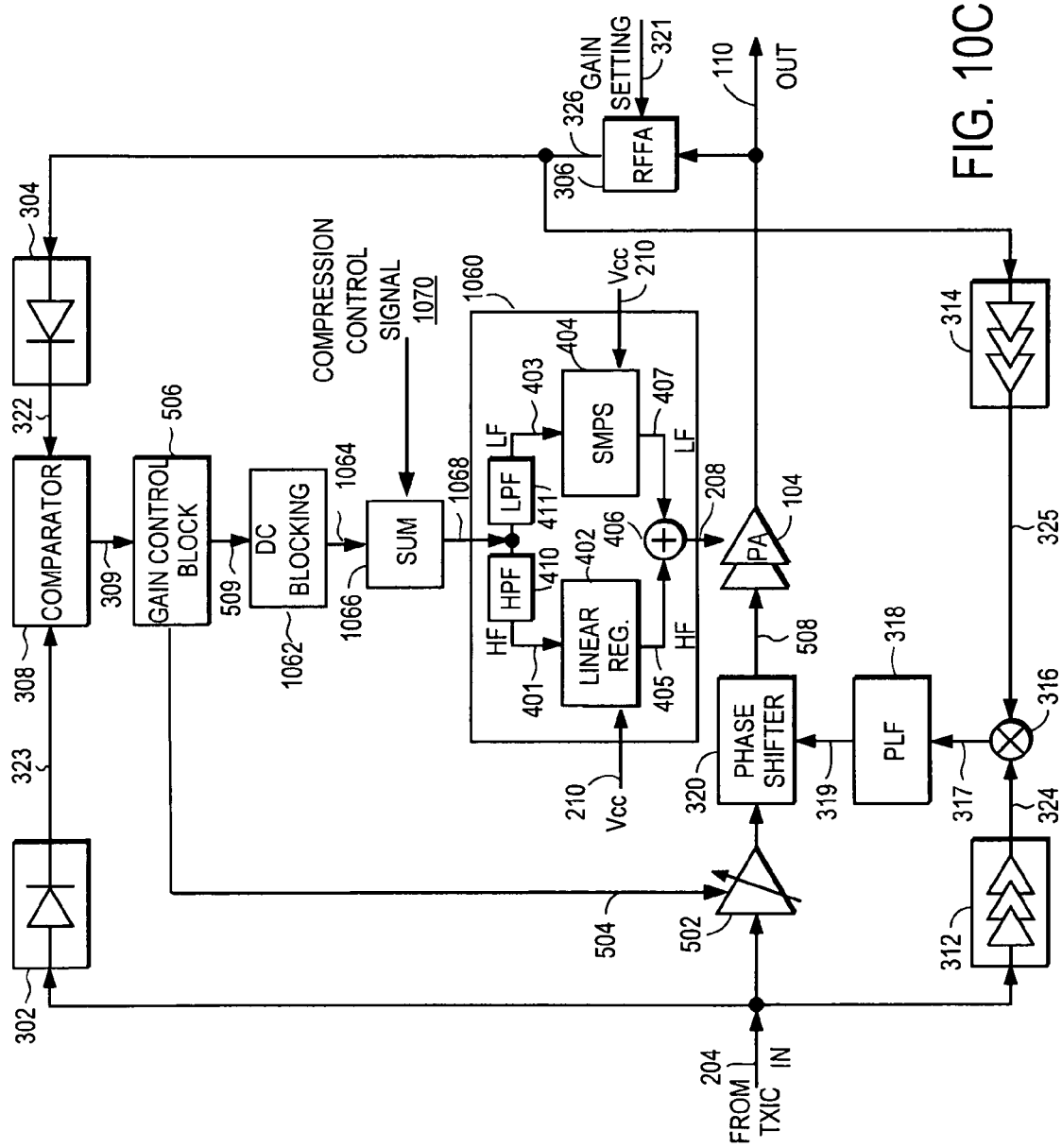
FIG. 10C illustrates an RF power amplifier system, in accordance with a fifth embodiment of the present invention.

FIG. 10C illustrates an RF power amplifier system, in accordance with a fifth embodiment of the present invention. The RF PA system illustrated in FIG. 10C is substantially the same as the RF PA system illustrated in FIG. 10A, except that DC blocking module 1062 is now in series with the amplitude correction signal 509 which controls power supply 1060 and filters out (blocks) DC components of the amplitude correction signal 509 from gain control block 506 to output primarily the AC components of the amplitude correction signal 509. The compression control signal 1070 is a DC or low frequency signal that is used to set the average voltage 208 supplied to PA 104 by power supply 1060. The AC components 1064 of the amplitude correction signal 509 and the compression control signal 1070 are summed in the summing module 1066 to generate a modified amplitude correction signal 1068. The modified amplitude correction signal 1068 sets the voltage 208 supplied by power supply 1060 to the PA 104.

Thus, the amplitude correction loop adjusts the voltage 208 supplied by power supply 1060 based upon only the AC components 1064 of the amplitude correction signal 309. The AC components 1064 passed by the DC blocking module (also referred to herein as a frequency blocking module or frequency selection module) 1062 include sufficiently low frequencies to ensure that the power supply 1060 contributes to correcting the amplitude error of the PA 104 even at low frequencies. The average voltage 208 supplied to PA 104 by power supply 1060 is set by the compression control signal 1070, which is added to the AC components 1064 of the power supply control signal 509. The control polarity is designed such that by increasing the level of the compression control signal 1070, power supply 1060 decreases its average voltage 208 supplied to the PA 104 and thus decreases the headroom of PA 104. Decreased headroom for PA 104 results in the PA 104 operating in a higher depth beyond compression with improved power efficiency, with a tradeoff in spectral occupancy performance due to increased amplitude of the variation of the supply voltage 208 to the PA 104.

Although the fifth embodiment of FIG. 10C is illustrated herein as an improvement to the fourth embodiment of FIG. 5A with multiple power supplies 402, 404 (within overall power supply block 1060) generating the supply voltage 208 to the PA 104, note that the concepts of the fifth embodiment of FIG. 10C can also be used in a RF PA system with a single power supply controlling the supply voltage 208 to the PA 104.

Figure 10D:
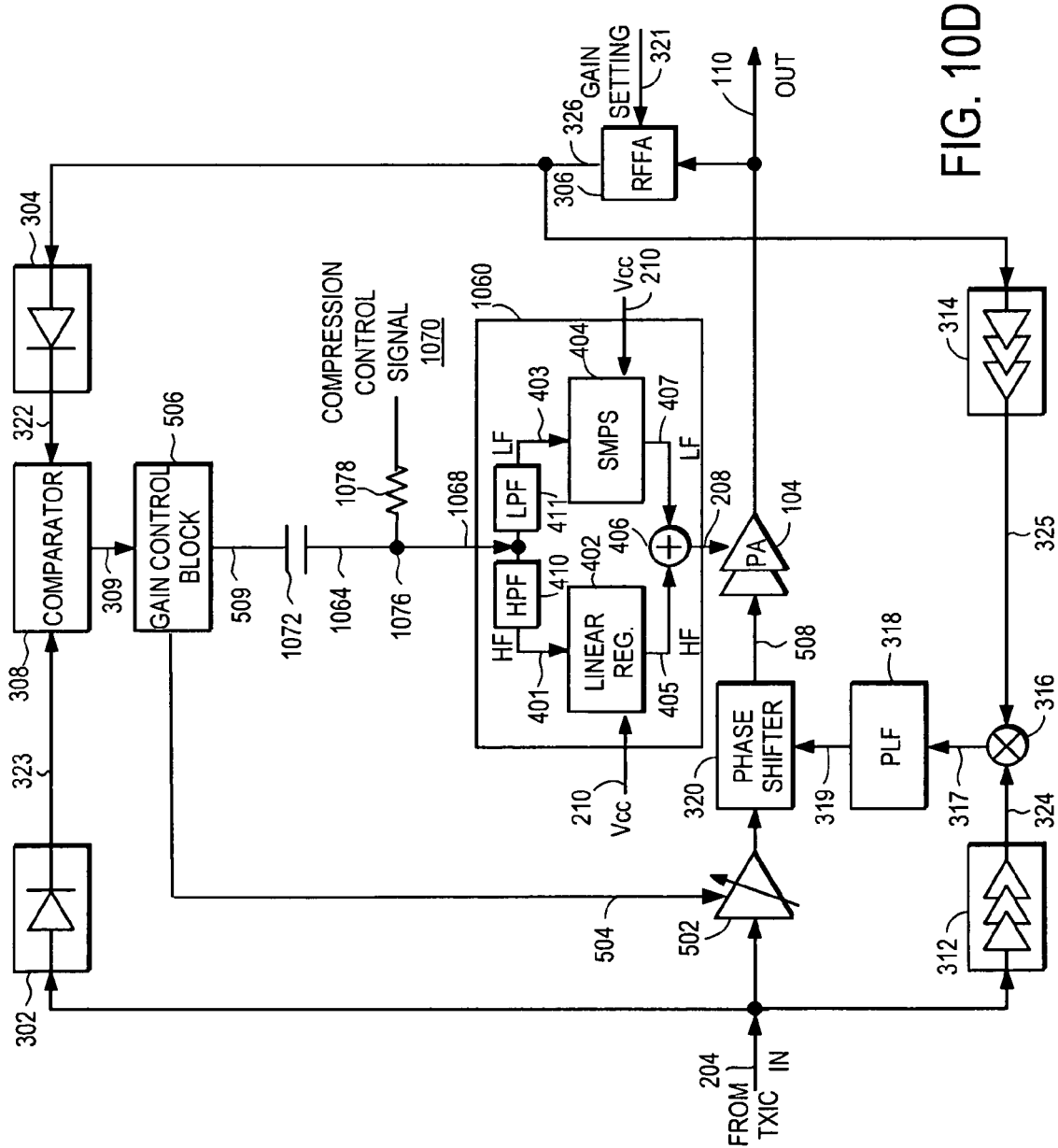
FIG. 10D illustrates an implementation example of the RF power amplifier system of FIG. 10C, in accordance with the fifth embodiment of the present invention.

FIG. 10D illustrates an implementation example of the RF power amplifier system of FIG. 10C in accordance with the fifth embodiment of the present invention. The example circuitry of FIG. 10D is substantially the same as the RF PA system of FIG. 10C, except that the DC blocking module 1062 of FIG. 10C is implemented as a capacitor 1072, a resistor 1078 is added in series to the compression control signal 1070, and the summing block 1066 is implemented as a simple current summing node 1076.

The capacitor 1072 blocks the DC components of the amplitude correction signal 509 to output primarily the AC components 1064 of the amplitude correction signal 509. The compression control signal 1070 imposes a DC level to control the average voltage 208 of power supply 1060. The combination of resistor 1078 and capacitor 1072 forms a frequency-selective network that passes frequencies above $F=1/(2\pi RC)$ from the amplitude correction signal 509 and passes frequencies below $F=1/(2\pi RC)$ from the compression control signal 1070, where R is the resistance value of the resistor 1078 and C is the capacitance value of the capacitor 1072. For example, the capacitance value C of capacitor 1072 may be 1 nF and the resistance value R of resistor 1078 may be 5.3 KOhms, resulting in F=30 KHz. The AC components 1064 above the frequency F of the amplitude correction signal 509 and the DC frequency components below the frequency F of the compression control signal 1070 are summed in the summing node 1076 to generate a modified amplitude correction signal 1068. The modified amplitude correction signal 1068 sets the voltage 208 of power supply 1060.

Thus, the voltage 208 supplied by power supply 1060 is based upon only the AC components of the amplitude correction signal 509 above frequency F. The average voltage 208 to PA 104 is set by the DC components of the compression control signal 1070, which are superimposed on the AC components 1064 of the amplitude correction signal 509. By increasing the level of the compression control signal 1070, the power supply 1060 decreases its average voltage 208 and thus increases the level of compression of the PA 104.

Figure 10E:
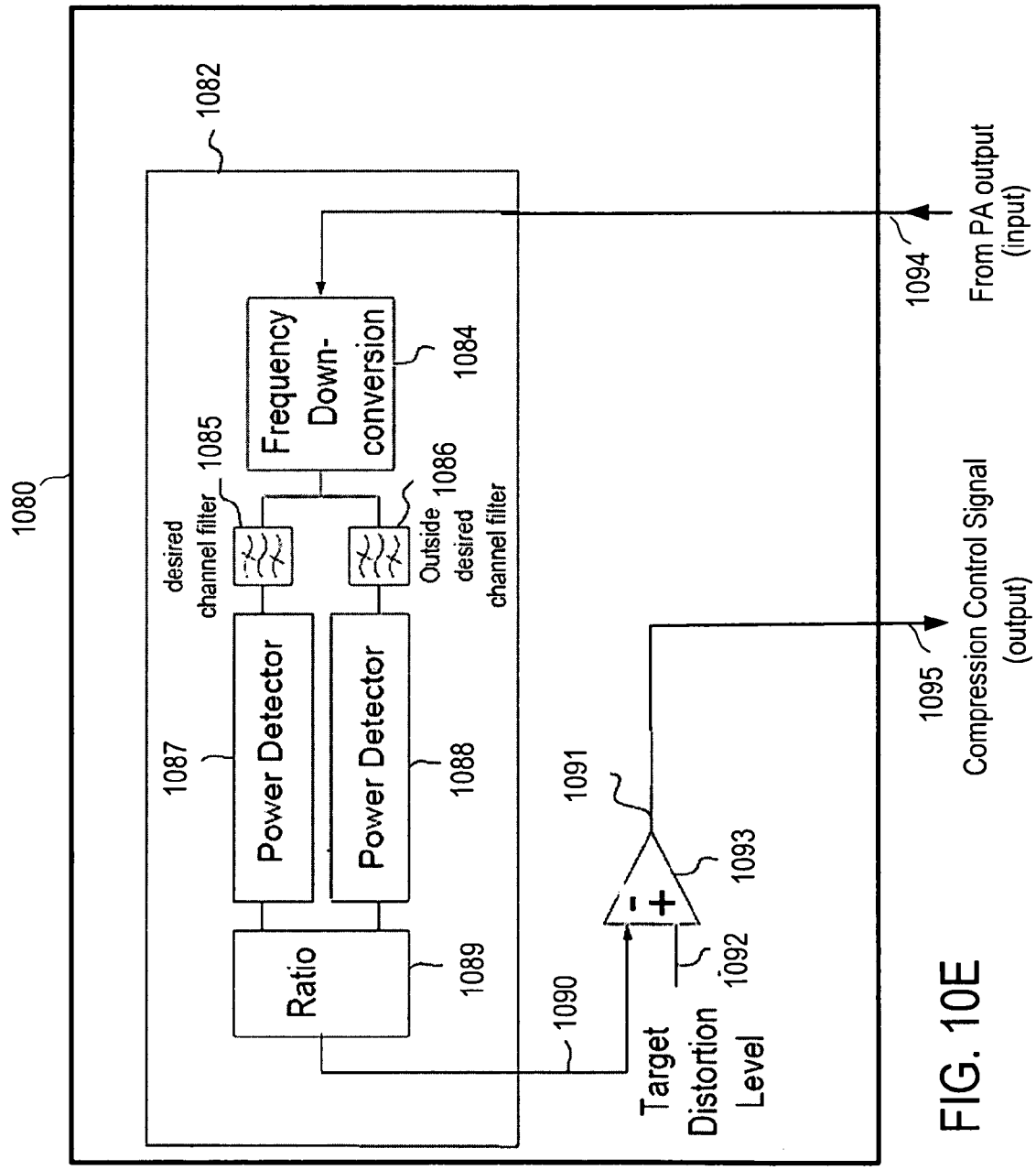
FIG. 10E illustrates an implementation example of generating the compression control signal used in FIGS. 10A, 10B, 10C, and 10D.

FIG. 10E illustrates an implementation example of generating the compression control signal used in FIGS. 10A, 10B, 10C, and 10D, utilizing distortion control module 1080. The distortion control module 1080 samples a signal at distortion measurement input 1094 (input) and provides a compression control signal 1095 (output) based on the difference between the distortion determined at input 1094 and target distortion level 1092. Input 1094 is typically coupled to PA output signal 110 or 326 in the relevant embodiments. The compression control signal 1095 is equivalent to the compression control signal 1001 in FIG. 10A, and the compression control signal 1070 in FIG. 10C.

Returning to FIG. 10E, distortion measurement module 1082 is hereby described. Distortion measurement module 214 comprises a frequency down-conversion module 1084, a pair of filters 1085, 1086, a pair of power detectors 1087, 1088, and a ratio calculation module 1089. Input signal 1094 is down-converted through a frequency down-conversion module 1084. In one embodiment, the frequency down-conversion module 1084 comprises an I/Q demodulator (not shown). The frequency down-conversion module 1084 outputs the down-converted signal to two different filters: a desired channel filter 1085 and an outside desired channel filter 1086. The filters 1085, 1086 can be analog or digital filters. The desired channel filter 1085 is configured to pass frequencies within the desired channel and remove frequencies outside the desired channel. The outside desired channel filter 1086 is configured to pass frequencies within one or more ranges outside the range of the desired frequency channel. According to various embodiments, the frequency ranges passed by the outside desired channel filter 1086 can include frequencies in an adjacent channel, an alternate channel, a combination of an adjacent channel and an alternate channel, or any other combination of frequency ranges outside the desired channel. Each filter 1085, 1086 outputs a filtered signal to a power detector 1087, 1088, respectively, for determining power levels of the filtered signals. As used in combination with the desired channel filter 1085, the power detector 1087 determines and outputs a power level corresponding to the signal power in the desired channel. The power detector 1088 determines and outputs a power level corresponding to the signal power outside of the desired channel (e.g., adjacent channel power, alternate channel power, or a combination of the two). The outputs of the power detectors 1087, 1088 are coupled to the ratio calculation module 1089 to determine the ratio of the outside desired channel power to the desired channel power. The ratio of these powers is a measure of distortion 1090. For example, the measure of distortion 1090 may be given by:

Measure of distortion(1090)=output of power detector (1088)/output of power detector(1087).

It may be desirable to design power detectors 1087 and 1088 as logarithmic amplifiers, to maximize the dynamic operating range of the circuit. In this case, the measure of distortion is given by:

Measure of distortion(1090)=output of power detector (1088)−output of power detector(1087).

The comparator 1093 compares this measured distortion level 1090 with a target distortion level 1092. As the measured PA distortion level 1090 decreases lower than the target distortion level 1092, the level of output 1095 increases. As the measured PA distortion level 1090 increases higher than the target distortion level 1092, the level of output 1095 decreases. As mentioned previously, the target distortion level 1092 may be chosen to ensure adjacent- and alternate-channel power levels meet cellular telephone standards.

Thus, the distortion control module 1080 may be part of a servo loop which attempts to target a specific acceptable distortion level 1092. Filtering and gain adjustment elements required for loop stability are not shown, and are typically required to stabilize the loop.

Note that while FIG. 10E describes a method of measurement of distortion, other methods may be substituted. For example, measurement of EVM (Error Vector Magnitude), Peak Amplitude Distortion, or any other measurement that represents distortion may be used.

With regards to FIG. 10A and FIG. 10C, and also referring to FIG. 10E, output 1095 is connected to compression control signal 1001 and 1070 in FIGS. 10A and 10C, respectively. As previously described, a decrease in the level of output 1095 indicates a level of distortion that is higher than the target distortion level 1092. Since output 1095 is connected to the compression control signal 1001 or 1070, a corresponding decrease in the compression of PA 104 results, which in turn results in a decrease in distortion at the output of PA 104. Thus, a servo loop is created, with the system targeting the target distortion level 1092. Such a control loop is desirable because it optimizes the efficiency of PA 104 by maintaining the maximum level of PA compression to enhance efficiency, while maintaining an acceptable level of distortion. Note that while FIG. 10E describes in detail a method for determining the level of distortion at the PA output, other methods may be substituted and are still within the spirit of the invention.

Figure 10F:
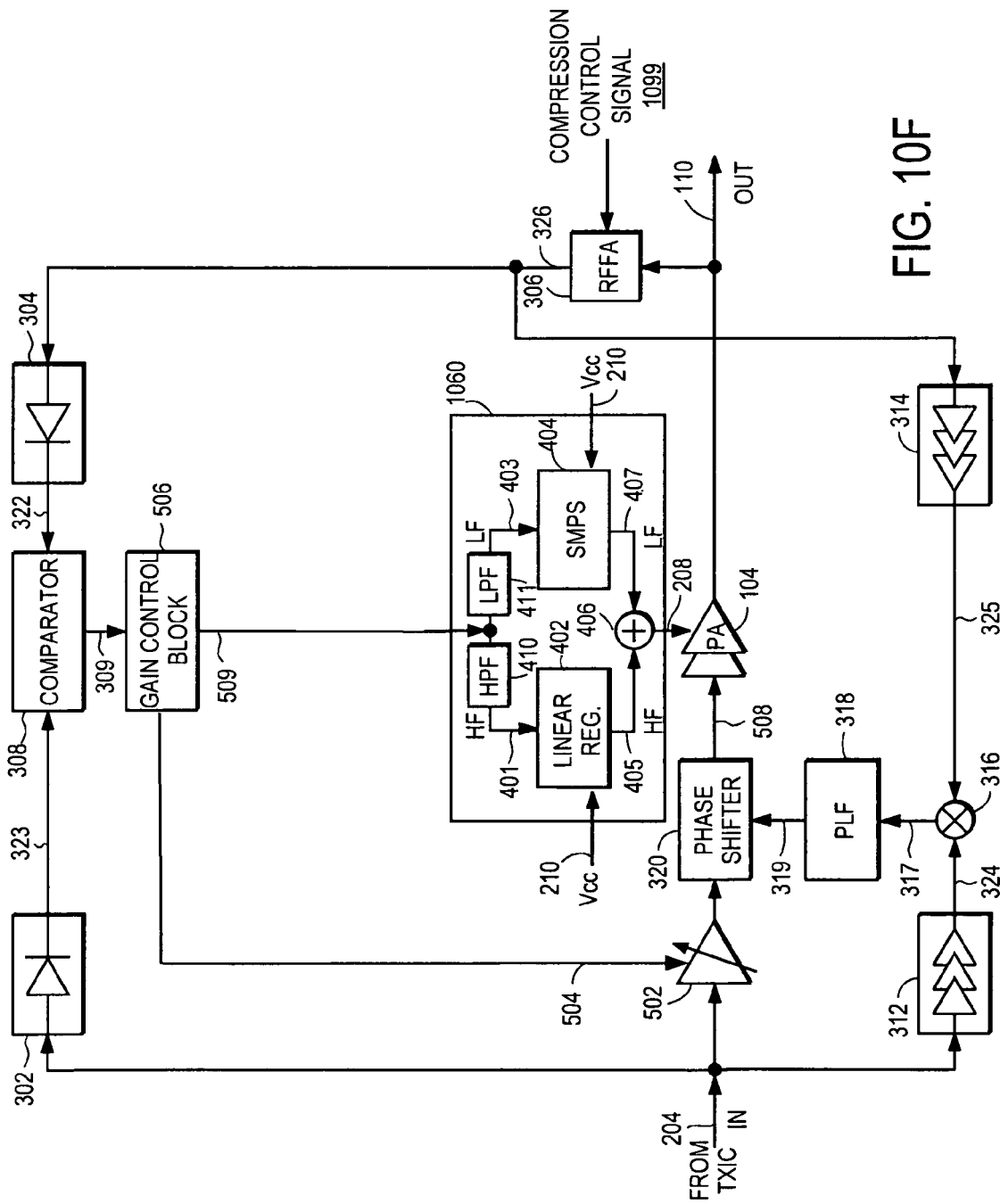
FIG. 10F illustrates an RF power amplifier system, in accordance with a sixth embodiment of the present invention.

FIG. 10F illustrates an RF power amplifier system, in accordance with a sixth embodiment of the present invention. The RF PA system illustrated in FIG. 10F is substantially the same as the RF PA system illustrated in FIG. 5A, except that compression control signal 1099 is used to control RFFA (RF Feedback Attenuator) 306. Reducing the attenuation at RFFA 306 has the effect of decreasing the overall amplitude closed loop gain, thus forcing PA 104 further into compression. Conversely, increasing the attenuation at RFFA 306 increases overall amplitude closed loop gain, and reduces the level of compression of PA 104. Thus, controlling RFFA 306 is an effective way to control the depth beyond compression of PA 104.

As mentioned previously, operating PA 104 at a greater depth beyond compression offers improved power efficiency, with a tradeoff in spectral occupancy performance due to the increased amplitude of the variation of the supply voltage 208 to the PA 104. Gain control block 506 may include circuitry to block or modify the DC components of amplitude correction signal 309 before passing this signal to VGA control 504. Note that while FIG. 10F describes in detail a technique for adjusting the overall amplitude closed loop gain, other methods may be substituted and are still within the spirit of the invention.

Figure 11:
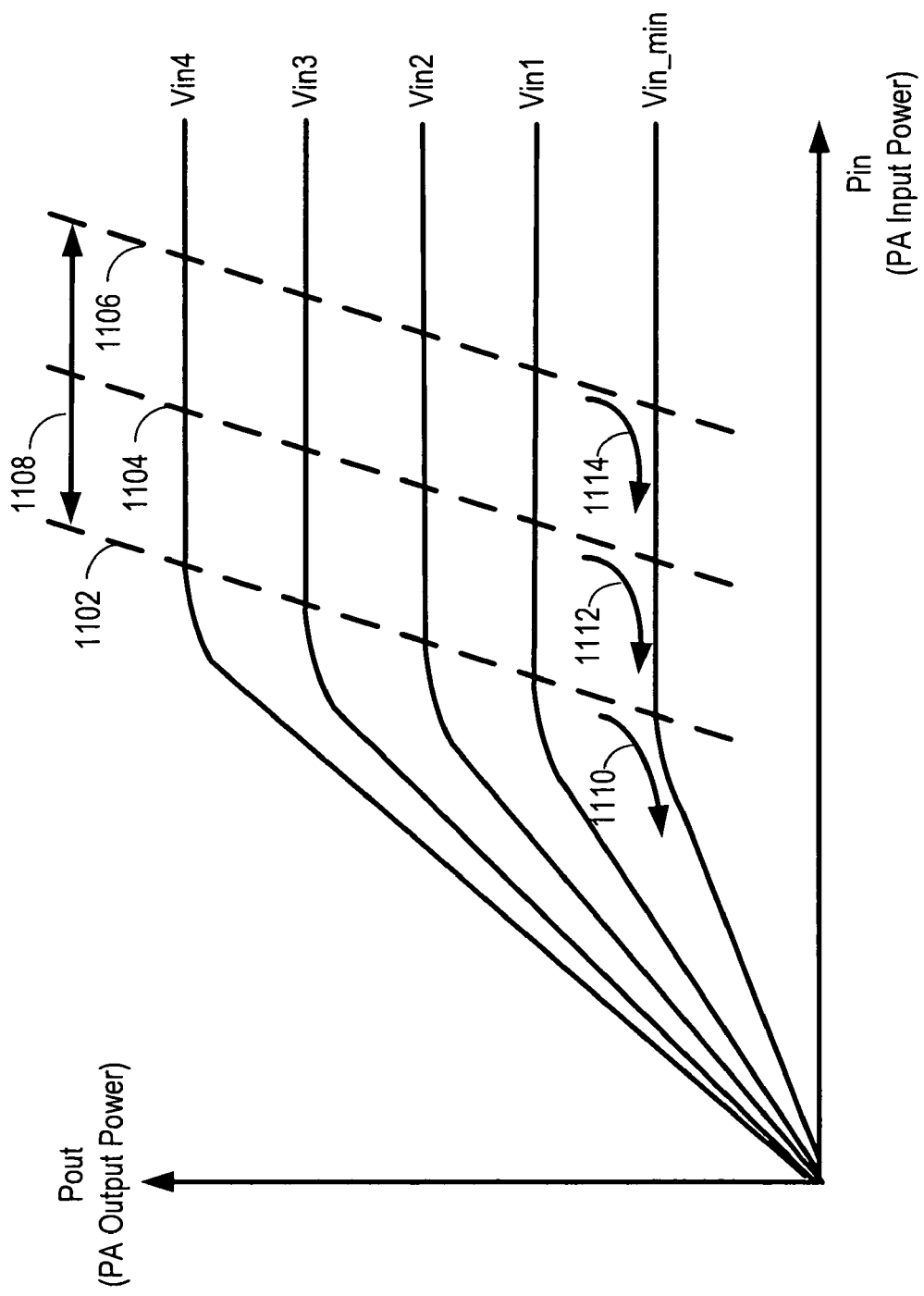
FIG. 11 illustrates how the RF power amplifier systems of FIGS. 10A, 10B, 10C, 10D, and 10F control the operation point of the RF PA.

FIG. 11 illustrates how the RF power amplifier system of FIGS. 10A, 10B, 10C, 10D, and 10F control the operation point of the RF PA. The graphs shown in FIG. 11 illustrate the relationship between the input power Pin to the PA 104 and the output power Pout of the PA 104. As shown in FIG. 11, the output power (Pout) of the PA 104 increases approximately linearly as the input power (Pin) is increased when the PA 104 operates in the region left of the compression line 1102. To the right of the compression line 1102, the output power of the PA 104 does not increase significantly with input power and increases primarily as the supply voltage 208 to the PA 104 increases from Vin1 to Vin2, to Vin3, and to Vin4, etc.

When operating in the range 1108 beyond the compression line 1102, the PA 104 operates in saturation. As operation of the PA 104 moves from line 1102 to 1104, and further towards line 1106, the PA 104 operates at an increased depth beyond compression. According to the fourth embodiment of FIGS. 10A and 10B, the fifth embodiment of FIGS. 10C and 10D, and the sixth embodiment of FIG. 10F, the compression control signal 1001, 1070, or 1099 may increase the depth beyond compression by increasing the average input power Pin to the PA 104 for a given output power Pout. The action of the amplitude control loop adjusts the PA power supply voltage 208 to maintain the expected gain relationship between RF input signal 204 and the RF output signal 110, thus forcing PA 104 to operate with lower gain and deeper in saturation.

As mentioned earlier, operating PA 104 at a higher depth beyond compression results in improved power efficiency. With an increase in depth beyond compression, a larger range of the output 110 of PA 104 is controlled by power supply voltage 208, thus ensuring that PA 104 remains in saturation through a larger portion of the amplitude signal swings—and therefore ensuring that the PA 104 operates with higher efficiency. However, the burden placed on the power supply circuitry, including linear regulator block 402 and SMPS block 404, due to a higher required variation of the supply voltage 208 to the PA 104, may result in reduction in spectral occupancy performance. Further, VGA 502 must handle a larger gain change when PA 104 transitions from saturation to linear operation if operating at a high depth beyond compression (this transition region is shown on FIG. 11 as the lines 1110, 1112, 1114 near Vin min, where PA supply voltage 208 reaches its minimum output voltage). The bandwidth and slew rate limitations of the VGA control loop may adversely affect spectral occupancy performance. Thus, the ability to adjust the depth beyond compression using the technique described in FIGS. 10A, 10B, 10C, 10D, and 10F offers a useful means of trading efficiency for spectral occupancy performance.

Upon reading this disclosure, those of skill in the art will appreciate still additional alternative structural and functional designs for the RF power amplifier controller through the disclosed principles of the present invention. For example, although the embodiments in FIGS. 4A, 5A, and 10A, 10B, 10C, 10D, and 10F split the amplitude correction signal 309 into two frequency ranges, it is possible to split the amplitude correction signal 309 into more than two different frequency ranges for separate processing by adjustable power supply components. The power amplifier controller circuit can be used with any type of power amplifier for many different types of electronic devices, although the embodiments are described herein with respect to a RF PA controller used in cellular telephone applications. Examples of these applications include video signals and Manchester coded data transmissions. For another example, digital techniques can be used to process some of the signals of the PA system described herein. Whether a signal is represented in an analog form or a digital form will not change the functionality or principles of operation of the amplitude and phase control loops of the PA system according to various embodiments of the present invention. For instance, based on the observation of the amplitude error signal 309, one could calculate a typical transfer function for the PA 104 and construct the signals that drive the PA at nodes 206, 208, which is still a form of closed loop control.

Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A radio frequency (RF) power amplifier system, comprising:
  a power amplifier coupled to receive and amplify an RF input signal to generate an RF output signal; and
  a power amplifier controller including:
    an amplitude control loop determining an amplitude correction signal indicative of an amplitude difference between an amplitude of the RF input signal and an attenuated amplitude of the RF output signal;
    a power supply adjusting a supply voltage or bias to the power amplifier based upon the amplitude correction signal;
    a frequency selection module blocking frequency components of the amplitude correction signal below a predetermined frequency to output AC components of the amplitude correction signal;
    a summation module summing a compression control signal and the AC components of the amplitude correction signal to generate a modified gain control signal; and
    a variable gain amplifier receiving the modified gain control signal and adjusting the amplitude of the RF input signal to the power amplifier based upon the modified gain control signal.

2. The RF power amplifier system of claim 1, wherein the compression control signal is a DC signal.

3. The RF power amplifier system of claim 1, wherein the compression control signal is indicative of a level of distortion at the RF output signal.

4. The RF power amplifier system of claim 3, wherein the level of distortion of the RF output signal is determined as a ratio of a first output power of a first portion of the RF output signal outside a desired frequency channel to a second output power of a second portion of the RF output signal within the desired frequency channel.

5. The RF power amplifier system of claim 1, wherein the compression control signal adjusts an average gain of the variable gain amplifier.

6. The RF power amplifier system of claim 1, wherein the frequency selection module comprises a capacitor connected in series with the amplitude correction signal.

7. The RF power amplifier system of claim 6, wherein the capacitor is connected to a resistor, and the resistor is connected in series to the compression control signal.

8. The RF power amplifier system of claim 1, further comprising:
- a phase control loop including:
  - a phase comparator comparing the phase of the RF input signal with the phase of the RF output signal to generate a phase error signal indicative of a phase difference between phases of the RF input signal and the RF output signal; and
  - a phase shifter coupled to the power amplifier, the phase shifter shifting the phase of the RF input signal to the power amplifier based upon the phase error signal to reduce phase distortion generated by the power amplifier.

9. The RF power amplifier system of claim 1, wherein the power supply comprises:
- a first power supply with a first efficiency, the first power supply receiving a first portion of the amplitude correction signal in a first frequency range and generating a first adjusted supply output based upon the first portion of the amplitude correction signal; and
- a second power supply with a second efficiency higher than the first efficiency, the second power supply receiving a second portion of the amplitude correction signal in a second frequency range lower than the first frequency range and generating a second adjusted supply output based upon the second portion of the amplitude correction signal, the adjusted supply voltage including a combination of the first adjusted supply output and the second adjusted supply output.

10. A radio frequency (RF) power amplifier system, comprising:
- a power amplifier coupled to receive and amplify an RF input signal to generate an RF output signal; and
- a power amplifier controller including:
  - an amplitude control loop determining an amplitude correction signal indicative of an amplitude difference between an amplitude of the RF input signal and an attenuated amplitude of the RF output signal;
  - a variable gain amplifier receiving the amplitude correction signal and adjusting the amplitude of the RF input signal to the power amplifier based upon the amplitude correction signal;
  - a frequency selection module including a capacitor connected in series with the amplitude correction signal and blocking frequency components of the amplitude correction signal below a predetermined frequency to output AC components of the amplitude correction signal;
  - a summation module summing a compression control signal and the AC components of the amplitude correction signal to generate a modified amplitude correction signal, the capacitor being connected to a resistor, and the resistor being connected in series to the compression control signal; and
  - a power supply adjusting a supply voltage or bias to the power amplifier based upon the modified amplitude correction signal.

11. The RF power amplifier system of claim 10, wherein the compression control signal is a DC signal.

12. The RF power amplifier system of claim 10, wherein the compression control signal is indicative of a level of distortion at the RF output signal.

13. The RF power amplifier system of claim 12, wherein the level of distortion of the RF output signal is determined as a ratio of a first output power of a first portion of the RF output signal outside a desired frequency channel to a second output power of a second portion of the RF output signal within the desired frequency channel.

14. The RF power amplifier system of claim 10, wherein the compression control signal adjusts an average of the adjusted supply voltage.

15. A radio frequency (RF) power amplifier system, comprising:
- a power amplifier coupled to receive and amplify an RF input signal to generate an RF output signal; and
- a power amplifier controller including:
  - an amplitude control loop determining an amplitude correction signal indicative of an amplitude difference between an amplitude of the RF input signal and an attenuated amplitude of the RF output signal;
  - a variable gain amplifier receiving the amplitude correction signal and adjusting the amplitude of the RF input signal to the power amplifier based upon the amplitude correction signal;
  - a frequency selection module blocking frequency components of the amplitude correction signal below a predetermined frequency to output AC components of the amplitude correction signal;
  - a summation module summing a compression control signal and the AC components of the amplitude correction signal to generate a modified amplitude correction signal;
  - a power supply adjusting a supply voltage or bias to the power amplifier based upon the modified amplitude correction signal; and
  - a phase control loop including:
    - a phase comparator comparing the phase of the RF input signal with the phase of the RF output signal to generate a phase error signal indicative of a phase difference between phases of the RF input signal and the RF output signal; and
    - a phase shifter coupled to the power amplifier, the phase shifter shifting the phase of the RF input signal to the power amplifier based upon the phase error signal to reduce phase distortion generated by the power amplifier.

16. The RF power amplifier system of claim 10, wherein the power supply comprises:
- a first power supply with a first efficiency, the first power supply receiving a first portion of the modified amplitude correction signal in a first frequency range and generating a first adjusted supply output based upon the first portion of the modified amplitude correction signal; and
- a second power supply with a second efficiency higher than the first efficiency, the second power supply receiving a second portion of the modified amplitude correction signal in a second frequency range lower than the first frequency range and generating a second adjusted supply output based upon the second portion of the modified amplitude correction signal, the adjusted supply voltage including a combination of the first adjusted supply output and the second adjusted supply output.

17. A radio frequency (RF) power amplifier system, comprising:
- a power amplifier coupled to receive and amplify an RF input signal to generate an RF output signal; and
- a power amplifier controller including:
  - an amplitude control loop determining an amplitude correction signal indicative of an amplitude difference between an amplitude of the RF input signal and an attenuated amplitude of the RF output signal;

a variable gain amplifier receiving the amplitude correction signal and adjusting the amplitude of the RF input signal to the power amplifier based upon the amplitude correction signal; and a power supply adjusting a supply voltage or bias to the power amplifier based upon the amplitude correction signal, wherein a closed loop gain of the amplitude control loop is adjusted by a compression control signal, and wherein the variable gain amplifier adjusts the amplitude of the RF input signal to the power amplifier based upon AC components of the amplitude correction signal.

18. A radio frequency (RF) power amplifier system, comprising:

a power amplifier coupled to receive and amplify an RF input signal to generate an RF output signal; and a power amplifier controller including:

an amplitude control loop determining an amplitude correction signal indicative of an amplitude difference between an amplitude of the RF input signal and an attenuated amplitude of the RF output signal;

a variable gain amplifier receiving the amplitude correction signal and adjusting the amplitude of the RF input signal to the power amplifier based upon the amplitude correction signal;

a power supply adjusting a supply voltage or bias to the power amplifier based upon the amplitude correction signal; and a variable attenuator coupled to the RF output signal, providing a variable attenuated amplitude of the RF output signal to the amplitude control loop, a compression control signal adjusting the attenuation of the variable attenuator, and wherein a closed loop gain of the amplitude control loop is adjusted by the compression control signal.

19. The RF power amplifier system of claim 17, wherein the compression control signal is indicative of a level of distortion at the RF output signal.

\* \* \* \* \*